United States Patent
Tsai et al.

(10) Patent No.: US 12,482,694 B2
(45) Date of Patent: Nov. 25, 2025

(54) ELECTRONIC PACKAGE AND SUCTION DEVICE

(71) Applicant: Advanced Semiconductor Engineering, Inc., Kaohsiung (TW)

(72) Inventors: Chun Hung Tsai, Kaohsiung (TW); Chenghan She, Kaohsiung (TW); Kuo-Chih Huang, Kaohsiung (TW); Kuan-Lin Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 655 days.

(21) Appl. No.: 17/711,762

(22) Filed: Apr. 1, 2022

(65) Prior Publication Data

US 2023/0317502 A1    Oct. 5, 2023

(51) Int. Cl.
*H01L 21/683*    (2006.01)
*H01L 21/67*    (2006.01)
*H01L 23/00*    (2006.01)

(52) U.S. Cl.
CPC .... *H01L 21/6838* (2013.01); *H01L 21/67144* (2013.01); *H01L 24/05* (2013.01); *H01L 24/13* (2013.01); *H01L 24/14* (2013.01); *H01L 2224/05624* (2013.01); *H01L 2224/05644* (2013.01); *H01L 2224/05647* (2013.01); *H01L 2224/13014* (2013.01); *H01L 2224/13147* (2013.01); *H01L 2224/1403* (2013.01); *H01L 2224/14131* (2013.01); *H01L 2224/1416* (2013.01)

(58) Field of Classification Search
CPC ........... H01L 21/67144; H01L 21/6838; H01L 24/05; H01L 24/13; H01L 24/14; H01L 2224/05624; H01L 2224/13014; H01L 2224/1403
See application file for complete search history.

(56) References Cited

U.S. PATENT DOCUMENTS

| | | | | |
|---|---|---|---|---|
| 5,056,296 A | * | 10/1991 | Ross | B29C 66/53461 53/329.2 |
| 5,250,843 A | * | 10/1993 | Eichelberger | H01L 23/538 257/E21.705 |
| 5,932,065 A | * | 8/1999 | Mitchell | H05K 3/3415 29/760 |
| 6,505,665 B1 | * | 1/2003 | Ulmer | H01L 24/29 156/382 |
| 2021/0327731 A1 | * | 10/2021 | Chang | H01L 21/68714 |

* cited by examiner

*Primary Examiner* — Saul Rodriguez
*Assistant Examiner* — Brendan P Tighe
(74) *Attorney, Agent, or Firm* — FOLEY & LARDNER LLP

(57) ABSTRACT

A method for manufacturing an electronic package and a suction device are provided. The method includes: providing an electronic component having a first surface and including at least one conductive stud on the first surface; providing a suction device having at least one recess; and moving the electronic component with the suction device, wherein an edge of the at least one recess does not overlap the at least one conductive stud from a top view while moving the electronic component with the suction device.

6 Claims, 21 Drawing Sheets

ELECTRONIC PACKAGE AND SUCTION DEVICE

BACKGROUND

1. Field of the Disclosure

The present disclosure relates to an electronic package and a suction device, and in particular, to picking up electronic components using a suction device.

2. Description of the Related Art

In the recombination process for manufacturing electronic packages, a pick-and-place machine is needed to handle semiconductor dice. However, edges of vacuum nozzles of the pick-and-place machine may contact and collide with conductive studs protruding from an active surface of the semiconductor die, causing damage to the edges of the vacuum nozzles and further causing the conductive studs to tilt or shift. In addition, exfoliated debris generated by the damage of the edges of the vacuum nozzles may fall on a working area of a carrier during the recombination process, causing the semiconductor dice to be tilted and affecting a yield of subsequent processes.

SUMMARY

In some arrangements, a method for manufacturing an electronic package includes providing an electronic component having a first surface and including at least one conductive stud on the first surface, providing a suction device having at least one recess, and moving the electronic component with the suction device. An edge of the at least one recess does not overlap the at least one conductive stud from a top view while moving the electronic component with the suction device.

In some arrangements, a method for manufacturing an electronic package includes providing an electronic component comprising at least one first conductive stud at a first region of a surface of the electronic component and at least one second conductive stud at a second region of the surface distinct from the first region, providing a suction device having at least one suction hole, locating the suction hole closer to the second region than to the first region, and contacting the at least one first conductive stud by the suction device with the at least one second conductive stud spaced from an edge of the suction hole.

In some arrangements, a suction device includes at least one suction hole. The at least one suction hole and a structure of the suction device are configured to prevent damaging at least one conductive stud on an electronic component when picking up the electronic component by the suction hole.

BRIEF DESCRIPTION OF THE DRAWINGS

Arrangements of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
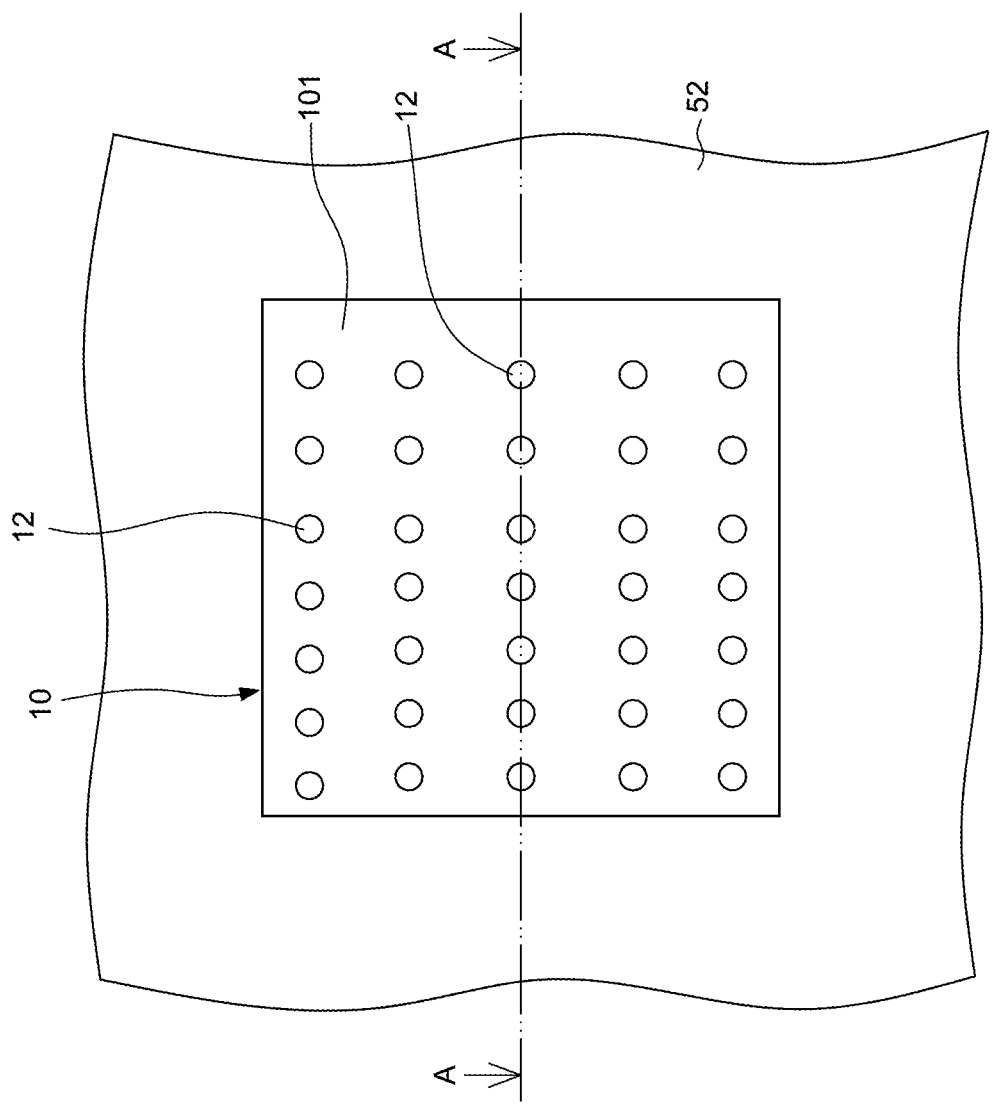
FIG. 1 illustrates a top view of an example of an electronic component according to some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Figure 2:
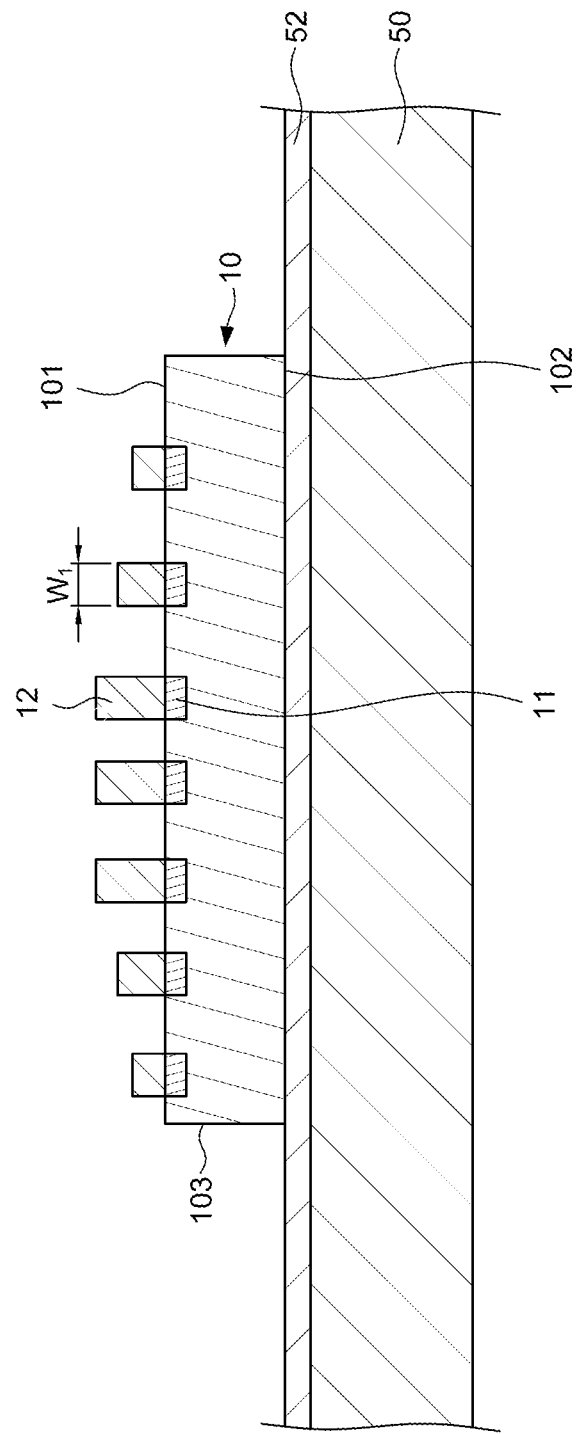
FIG. 2 illustrates a cross-sectional view taken along line A-A of the electronic component 10 of FIG. 1 according to some arrangements of the present disclosure.

FIG. 1 through FIG. 6 illustrate manufacturing an electronic package according to some arrangements of the present disclosure. FIG. 1 illustrates a top view of an example of an electronic component 10 according to some arrangements of the present disclosure. FIG. 2 illustrates a cross-sectional view taken along line A-A of the electronic component 10 of FIG. 1, according to some arrangements. The electronic component 10 may be attached to a release layer 52 that is formed or disposed on a carrier 50. As shown in FIG. 2, the release layer 52 is between the carrier 50 and the electronic component 10. The electronic component 10 is attached to the carrier 50 via the release layer 52. The electronic component 10 directly contacts the release layer 52.

The electronic component 10 may be, for example, an electronic device or a semiconductor die. As shown in FIG. 2, the electronic component 10 may have a first surface 101 (e.g., an active surface), a second surface 102 (e.g., a backside surface), and lateral side surfaces 103. The second surface 102 is opposite to the first surface 101, and a lateral side surface 103 extends between the first surface 101 and the second surface 102. In some examples, an active surface is defined as the surface on which conductive elements (e.g., at least one conductive pad 11, at least one conductive stud 12, or so on) used for transferring signal and/or power transfer. The electronic component 10 may include at least one conductive pad 11 and at least one conductive stud 12 disposed on or embedded in the first surface 101. A material of the conductive pad 11 may include copper, aluminum, or gold. The conductive pad 11 may be disposed on or adjacent to or exposed from the first surface 101 of the electronic component 10. The conductive stud 12 may be disposed on or adjacent to the first surface 101 and disposed on the conductive pad 11. In some examples, the conductive pad 11 and the conductive stud 12 are in direct contact with one another. In some arrangements, a material of the conductive stud 12 may include copper (Cu). In some examples as shown, the conductive stud 12 may be in a pillar form, having a shape of a column with a circular cross section that extends from the first surface 101 and the conductive pad 11 in a direction that is perpendicular to or transverse to the first surface 101. In some arrangements, as shown in FIG. 2, the electronic component 10 may include a plurality of conductive pads 11 and a plurality of conductive studs 12. The conductive studs 12 may be spaced apart from each other and disposed on the conductive pads 11 respectively. In some examples, the conductive studs 12 and the conductive pads are physically arranged according to the same physical spacing from the top view. As shown in FIG. 2, the conductive stud 12 has a width $W_1$, which may be a diameter of the circular cross section of the conductive stud 12. The width $W_1$ may be measured along a direction that is parallel to the top surface 101.

Figure 3:
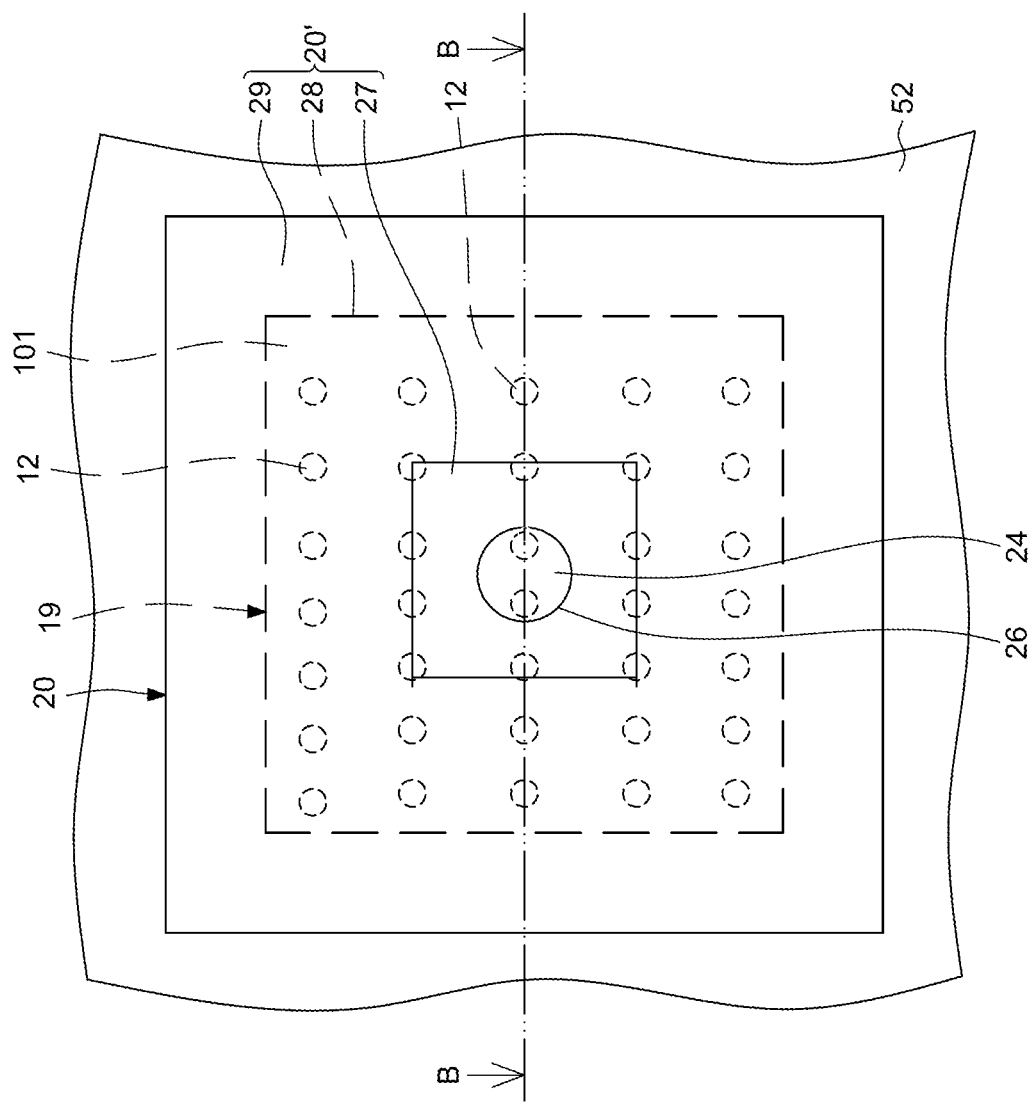
FIG. 3 illustrates a top view of one or more stages of an example of a method for manufacturing an electronic package according to some arrangements of the present disclosure.
Figure 4:
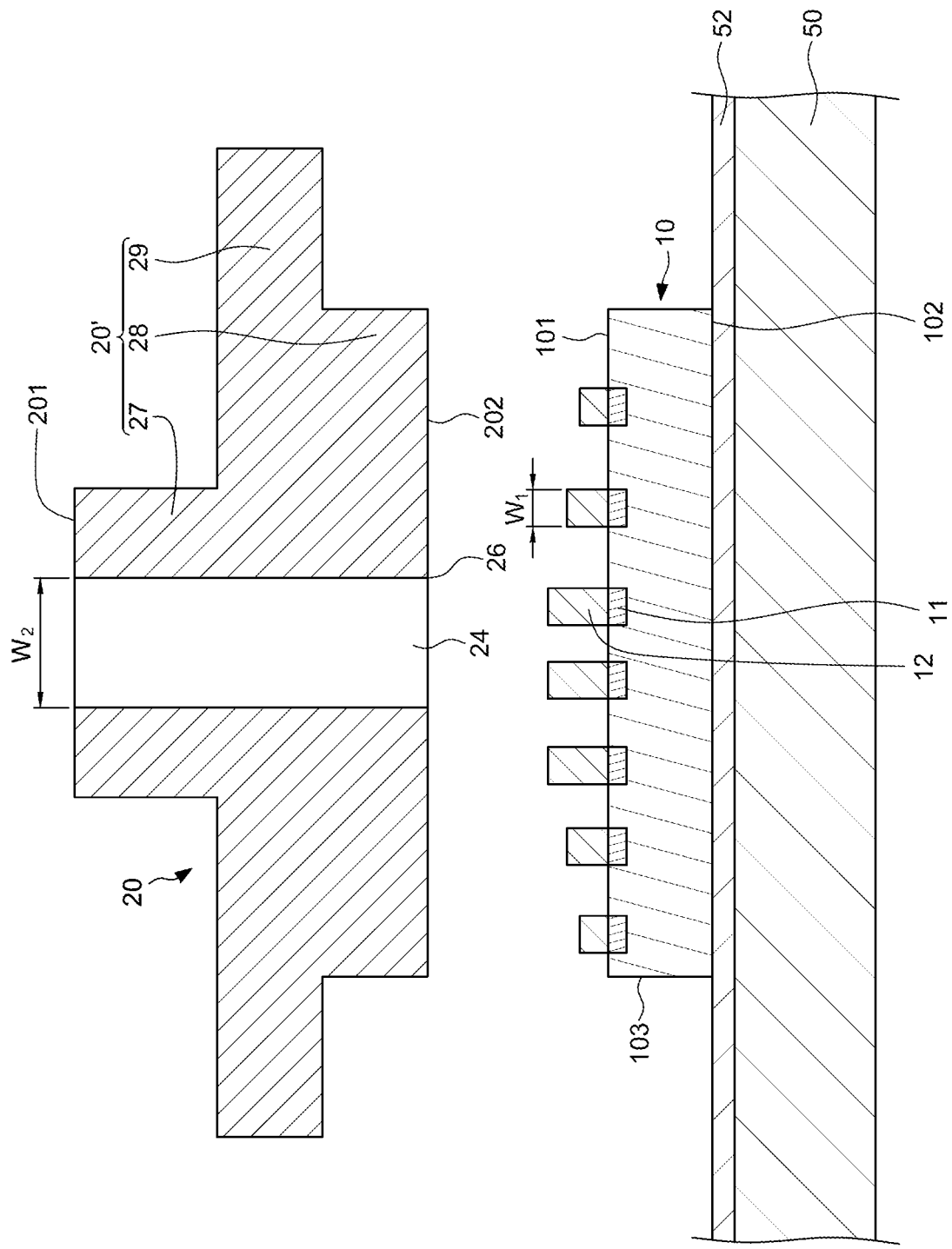
FIG. 4 illustrates a cross-sectional view taken along line B-B of FIG. 3 according to some arrangements of the present disclosure.
Figure 5:
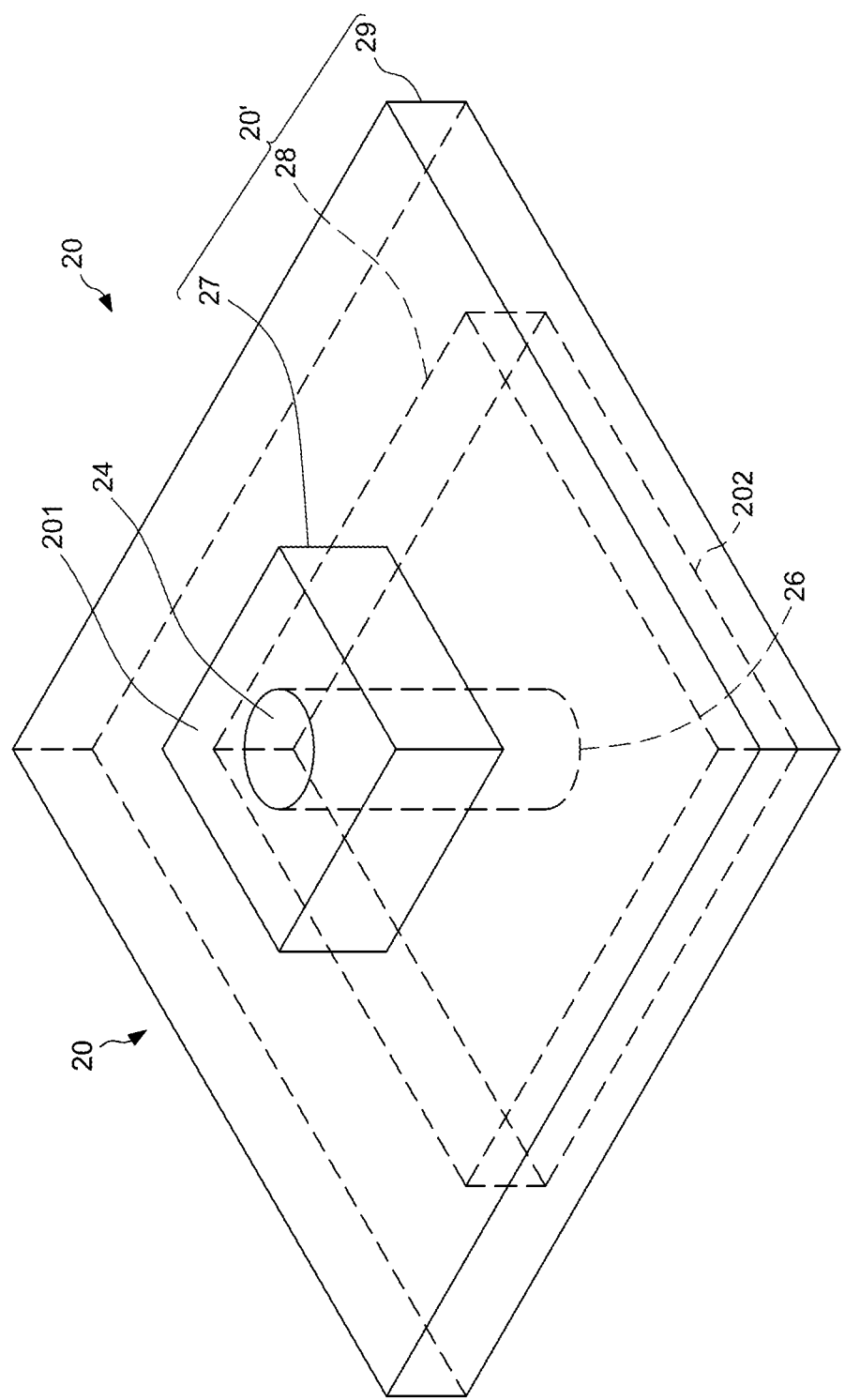
FIG. 5 illustrates a perspective view of an example of a suction device according to some arrangements of the present disclosure.

FIG. 3 illustrates a top view of one or more stages of an example of a method for manufacturing an electronic package according to some arrangements of the present disclosure. FIG. 4 illustrates a cross-sectional view taken along line B-B of FIG. 3 according to some arrangements of the present disclosure. FIG. 5 illustrates a perspective view of an example of a suction device 20 according to some arrangements of the present disclosure. With regard to FIGS. 3-5, a suction device 20 is provided and moved to a position above the first surface 101 of the electronic component 10. The suction device 20 is configured to suck the electronic component 10. In other words, the suction device 20 is configured to generate adhesion between the electronic component 10 (e.g., the first surface 101) and the suction device 20. The suction device 20 may be also referred to as "a nozzle" or "a suction head."

As shown in FIGS. 3-5, the suction device 20 may include a main body 20' and at least one recess 24. The main body 20' may include a first portion 27 (e.g., an upper portion), a second portion 28 (e.g., a lower portion), and an intermediate portion 29. The intermediate portion 29 is located between the first portion 27 and the second portion 28. The second portion 28 is oriented to be closer to the electronic component 10 than the first portion 27 and the intermediate portion 29. The first portion 27 that defines the at least one recess 25 may be connected to a vacuum pump (not shown) configured to draw air from the part of the at least one recess 25 closer to the electronic component 10 (e.g., defined by the second portion 28) toward the part of the at least one recess 25 defined by the intermediate portion 29 and the part of the at least one recess 25 defined by the first portion 27. Thus, a negative pressure (or a suction force) may be provided in the recess 24 through the vacuum pump in a direction from the part of the at least one recess 25 defined by the second portion 28 toward the part of the at least one recess 25 defined by the first portion 27. The second portion 28 is opposite to the first portion 27 in the suction device 20. The recess 24 may be also referred to as "a suction hole" or "a cavity." In some arrangements, as shown in FIG. 4, the recess 24 may extend through the main body 20' (including, for example, the first portion 27, the intermediate portion 29, and the second portion 28). In some arrangements as shown, a size (e.g., a width) of the intermediate portion 29 may be greater than a size (e.g., a width) of the second portion 28, and the size (e.g., the width) of the second portion 28 may be greater than a size (e.g., a width) of the first portion 27. In some arrangements as shown, a size (e.g., a width) of the intermediate portion 29 may be greater than a size (e.g., a width) of the first portion 27. The width of the first portion 27, the second portion 28, and the intermediate portion 29 are measured along a direction or axis that is parallel to the surfaces 101, 102, 201, and/or 202.

The main body 20' may have a top surface (e.g., a first surface) 201 (e.g., a top surface of the first portion 27) and a bottom surface (e.g. a second surface) 202 (e.g., a bottom surface of the second portion 28). The bottom surface 202 is opposite to the top surface 201. The second surface 202 is configured to face the electronic component 10 for performing suction functionalities. In some arrangements, the recess 24 may extend between and in communication with the top surface 201 and the bottom surface 202. That is, each of the at least one recess 24 may have an opening defined on a position on the bottom surface 202 and an opening defined on a position on the top surface 201. The recess 24 may be configured for sucking the electronic component 10 or adhering the bottom surface 202 to the electronic component 10 using suction force. The recess 24 have an edge 26 on the bottom surface 202 facing the first surface 101 of the electronic component 10. In some arrangements, as shown in FIG. 4, the edge 26 of the recess 24 may be positioned to misalign with an entirety of the width $W_1$ of one or more conductive studs 12 along a vertical direction. That is, the main body 20' is positioned with respect to the electronic component 10 such that the edge 26 of the recess 24 does not overlap with the conductive studs 12 from the top view, along the vertical direction, and the edge 26 does not contact the conductive studs 12 when adhesion occurs due to suction. The vertical direction is perpendicular or transverse to one or more of the surfaces 201, 202, 101, 102, or the surface of the release layer 52 facing the electronic component 10, in some examples. In some examples, the vertical direction is parallel to the direction or axis in which the recess 24 extends from the top surface 201 to the bottom surface 202. In some examples, the vertical direction is parallel to the direction in which the inner walls of the recess 24 extends from the top surface 201 to the bottom surface 202. Accordingly, the conductive studs 12 may be located or positioned either entirely inside or entirely outside a vertical projection area of the recess 24. That is, the vertical projection area of the recess 24 along the vertical direction from the top view may be free from extending through a downward projection of the conductive stud 12. In some arrangements, a width $W_2$ of the recess 24 may be greater than a width $W_1$ of the conductive stud 12. In some arrangements, a width $W_2$ of the recess 24 may be greater than a multiple (e.g., N) of the width $W_1$ of the conductive stud 12 and less than the next multiple (e.g., N+1) of the width $W_1$ of the conductive stud 12.

Figure 6:
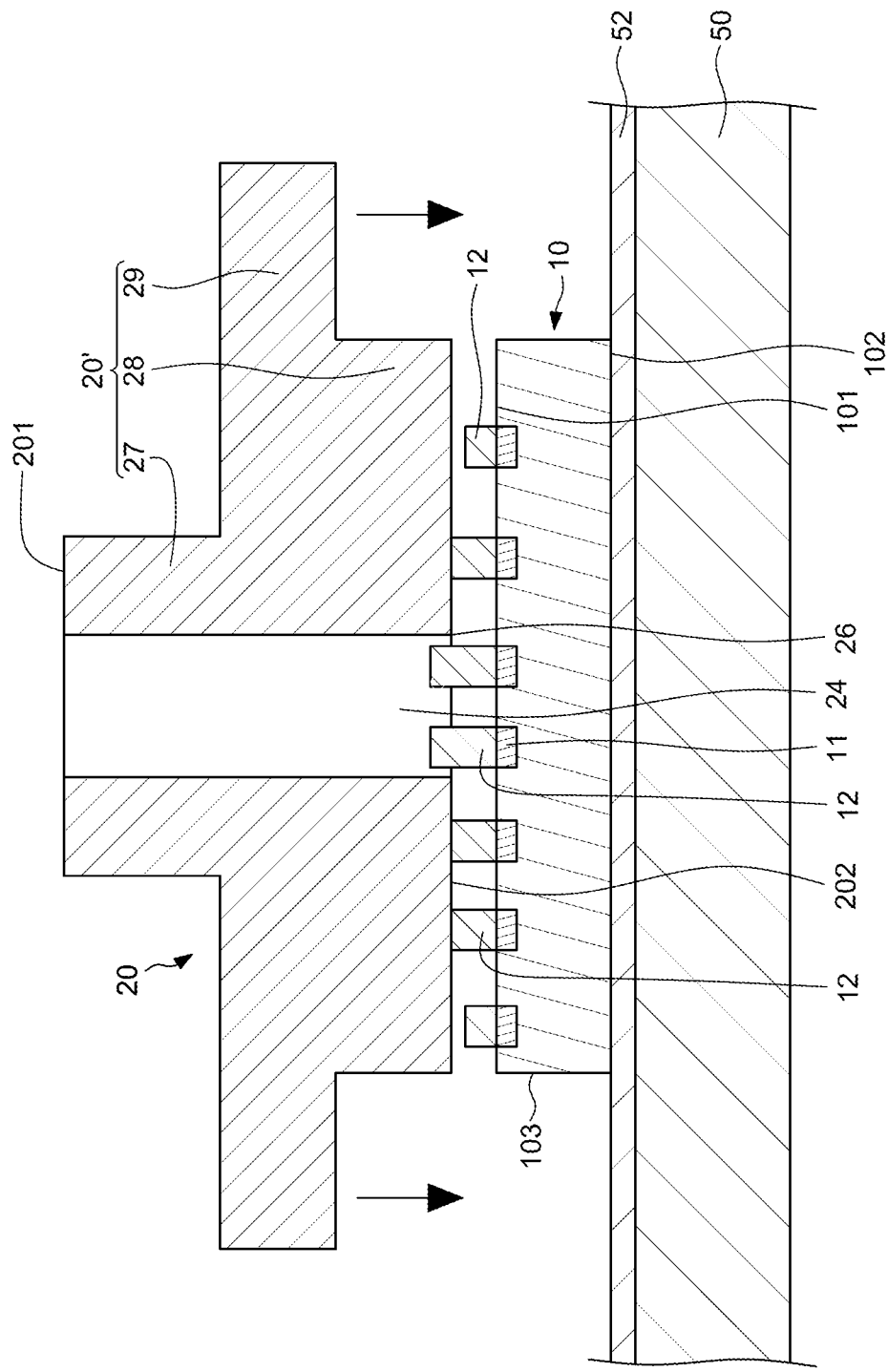
FIG. 6 illustrates a cross-sectional view of one or more stages of an example of a method for manufacturing an electronic package according to some arrangements of the present disclosure.

Referring to FIG. 6, the electronic component 10 is picked up (e.g., held, lifted, moved, repositioned, or so on) by the recess 24 of the suction device 20 in a retrieval or pickup process. In some arrangements, as shown in FIG. 6, first conductive studs of the conductive studs 12 may be inserted into, drawn into or enclosed by the recess 24 by the suction force. Second conductive studs of the conductive studs 12 may directly contact the bottom surface 202 of the main body 20' of the suction device 20 due to the suction force. The first conductive studs of the conductive studs 12 may not contact the bottom surface 202 of the main body 20' of the suction device 20 during the pickup process. In some arrangements, the second conductive studs of the conductive studs 12 may be compressed by the bottom surface 202 of the main body 20' to level the upper surfaces of the plurality of conductive studs 12, so that the compressed second conductive studs may have a substantially equal height relative to the surface 101 along or parallel to the vertical direction. In some arrangements, as shown in FIG. 6, the bottom surface 202 of the main body 20' may be spaced apart from the first surface 101 of the electronic component 10 by the second conductive studs while the suction force is being applied during the pickup process.

As shown in FIGS. 3-6, the spatial arrangement of the at least one recess 24 and the relative positions of the suction device 20 relative to the electronic component 10 is configured to prevent damaging the at least one conductive stud 12 on the electronic component 10 when picking up the electronic component 10 by the at least one recess 24. Accordingly, no exfoliated debris will appear in the recombination process, leading to an increased yield of the subsequent process (e.g., a redistribution process).

Figure 7:
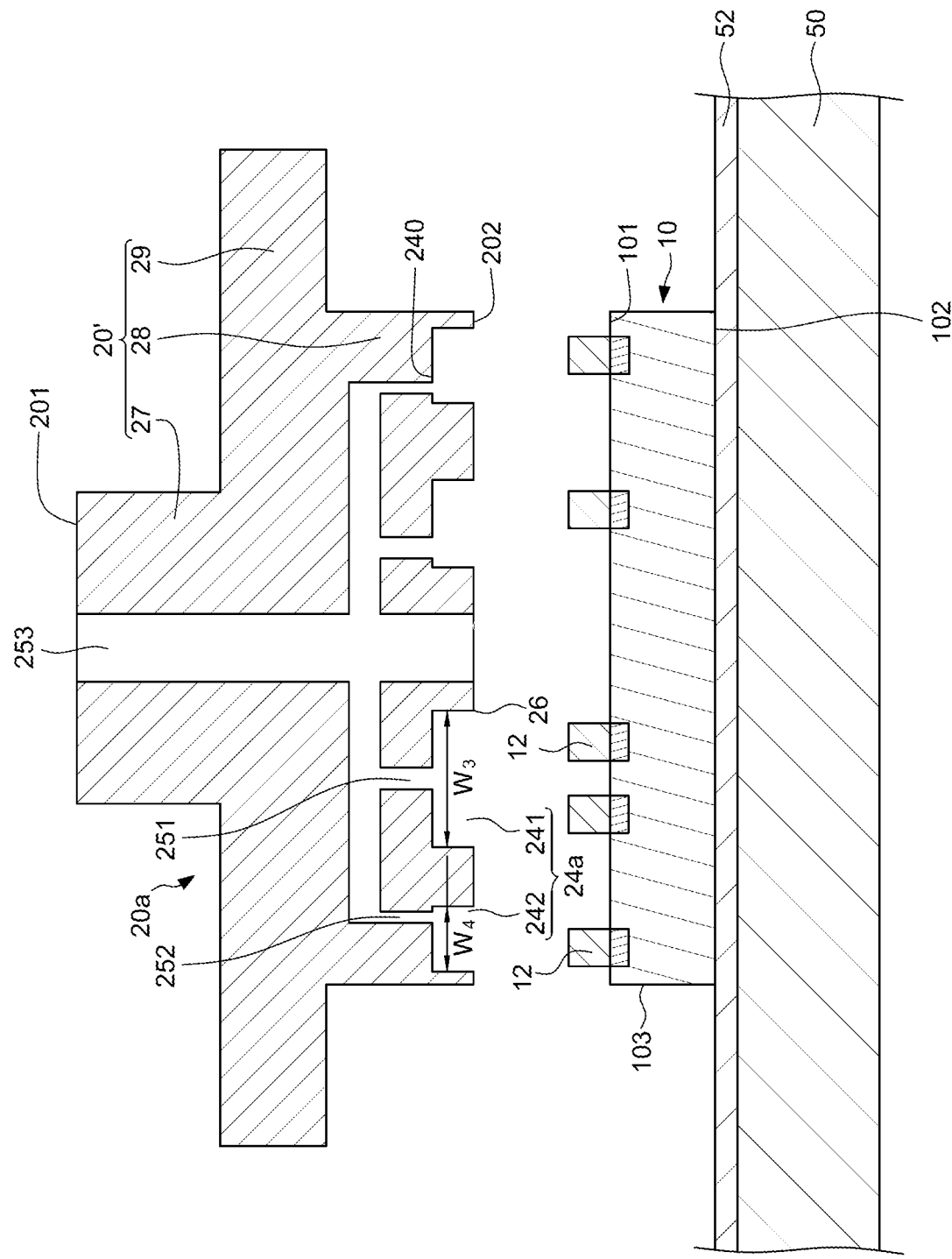
FIG. 7 illustrates a cross-sectional view of one or more stages of an example of a method for manufacturing an electronic package according to some arrangements of the present disclosure.
Figure 8:
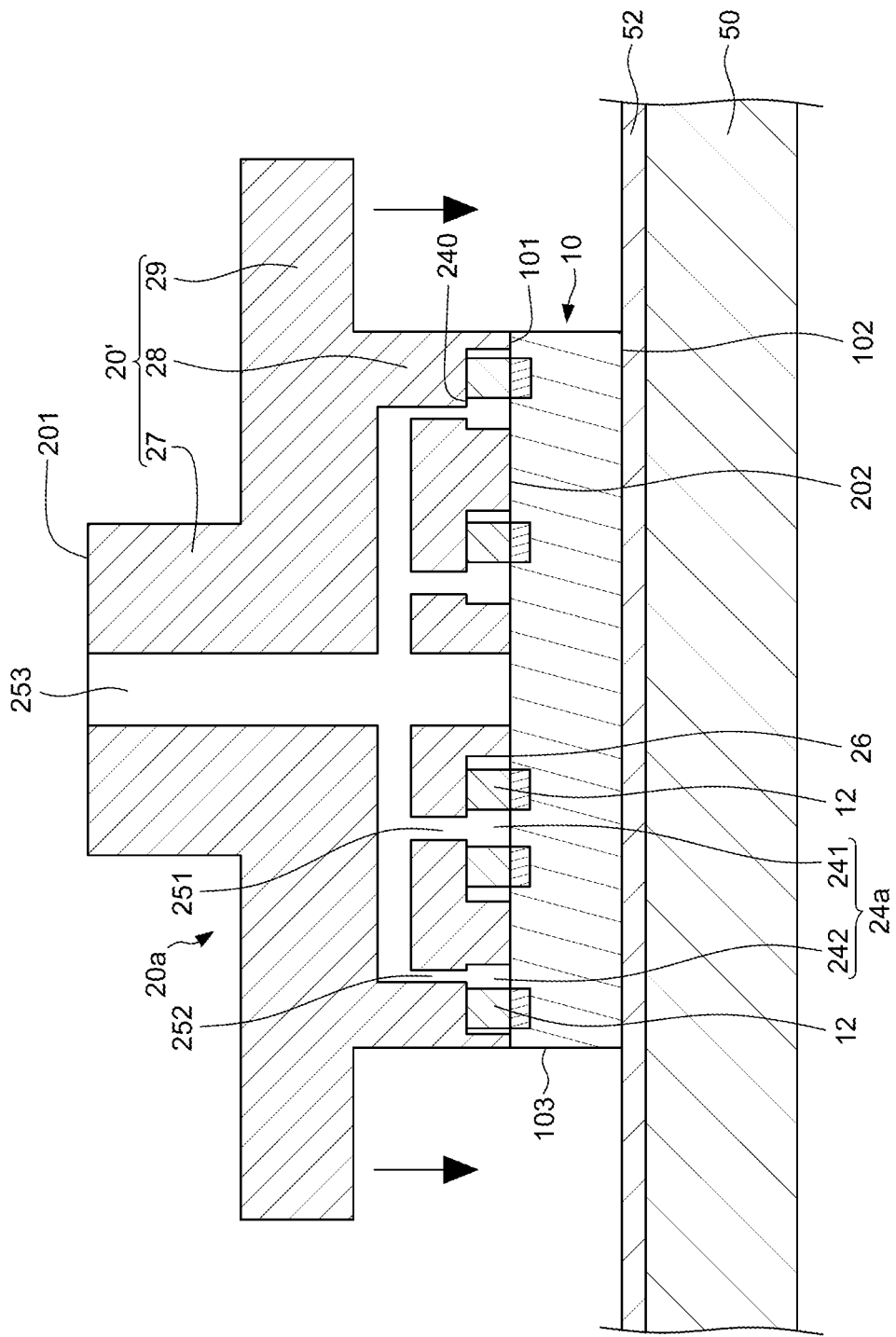
FIG. 8 illustrates a cross-sectional view of one or more stages of an example of a method for manufacturing an electronic package according to some arrangements of the present disclosure.

FIGS. 7 and 8 illustrate a method for manufacturing an electronic package according to some arrangements of the present disclosure. The initial several stages of the method corresponding to FIGS. 7 and 8 are the same as, or at least similar to, the stages illustrated in FIGS. 1 and 2. That is, the electronic component 10 shown in FIGS. 1 and 2 or an electronic component similar thereto is provided, although the positions of the conductive studs 12 and the conductive pad 11 shown in FIGS. 7 and 8 may be different from the positions of the conductive studs 12 and the conductive pad 11 shown in FIGS. 1-6. FIG. 7 depicts a stage subsequent to that depicted in FIG. 1 and FIG. 2.

The stage illustrated in FIG. 7 is different from the stage illustrated in FIG. 4 in that a structure of the suction device 20a is different from the structure of the suction device 20. Referring to FIG. 7, the suction device 20a may further include a plurality of vacuum passages (including, for example, at least one first vacuum passage 251, at least one second vacuum passage 252, and a third vacuum passage 253). The vacuum passages (e.g., the first vacuum passage 251, the second vacuum passage 252, and the third vacuum passage 253) may have volumes that are linked with each other and are in fluid communication with one another. In addition, the at least one recess 24a may not extend entirely through the suction device 20a along the vertical direction. The at least one recess 24a may include a plurality of recesses 24a including, for example, at least one first recess 241 (e.g., first suction hole) and at least one second recess 242 (e.g., second suction hole) that are recessed from the bottom surface 202 of the suction device 20a. The recesses 24a (e.g., the at least one first recess 241 and the at least one second recess 242) may have spatially inconsistent gaps therebetween. In some examples, spatially inconsistent gaps refer to the varying spacing between adjacent recesses 24a. In some arrangements, the first recess 241 may be linked to the first vacuum passage 251 (e.g., the first recess 241 and the first vacuum passage 251 are in fluid communication with one another), and the second recess 242 may be linked to the second vacuum passage 252 (e.g., the second recess 242 and the second vacuum passage 252 are in fluid communication with one another). The third vacuum passage 253 may extend entirely through the main body 20' (including, for example, the first portion 27, the intermediate portion 29 and the second portion 28), from the surface 201 to the surface 202. In some arrangements, a width $W_3$ (or a diameter) of the first recess 241 may be greater than a width W$_4$ (or a diameter) of the second recess 242. The width of the first recess 241 and the second recess 242 are measured along a direction or axis that is parallel to the surfaces 101, 102, 201, and/or 202. Accordingly, a negative pressure of the first vacuum passage 251 may be greater than a negative pressure of the second vacuum passage 252.

In some arrangements, as shown in FIG. 7, one or more the plurality of conductive studs 12 may be located or positioned within a downward projection area of the first recess 241 and a downward projection area of the second recess 242. The downward projection area of the first recess 241 and the downward projection area of the second recess 242 are areas of the respective ones of the first recess 241 and the second recess 242 as projected in a direction toward the electronic component 10 along or parallel to the vertical direction. In other words, the areas of at least some of the conductive studs 12 and the areas of the first recess 241 and the areas of the second recess 242 overlap from the top view. In some arrangements, a number of some of the conductive studs 12 that are in the downward projection area of the first recess 241 may be greater than a number of some of the conductive studs 12 that are in the downward projection area of the second recess 242.

The stage illustrated in FIG. 8 is the same as, or similar to, the stage illustrated in FIG. 6, except that the suction device 20a is positioned to directly contact the first surface 101 of the electronic component 10. Referring to FIG. 8, the bottom surface 202 of the suction device 20a may directly contact the first surface 101 of the electronic component 10. In addition, the conductive studs 12 may be substantially entirely inserted into, drawn into, or enclosed by the recesses 24a (including, for example, the at least one first recess 241 and the at least one second recess 242) when the suction force is being applied and the surface 202 is in direct contact with the surface 101. In some arrangements, the upper surfaces of the conductive studs 12 (facing the surface 201 and/or the portion 29) may directly contact an upper surface 240 (including, for example, an upper surface of the first recess 241 and an upper surface of the second recess 242) of the recess 24a when the suction force is being applied and the surface 202 is in direct contact with the surface 101.

Figure 9:
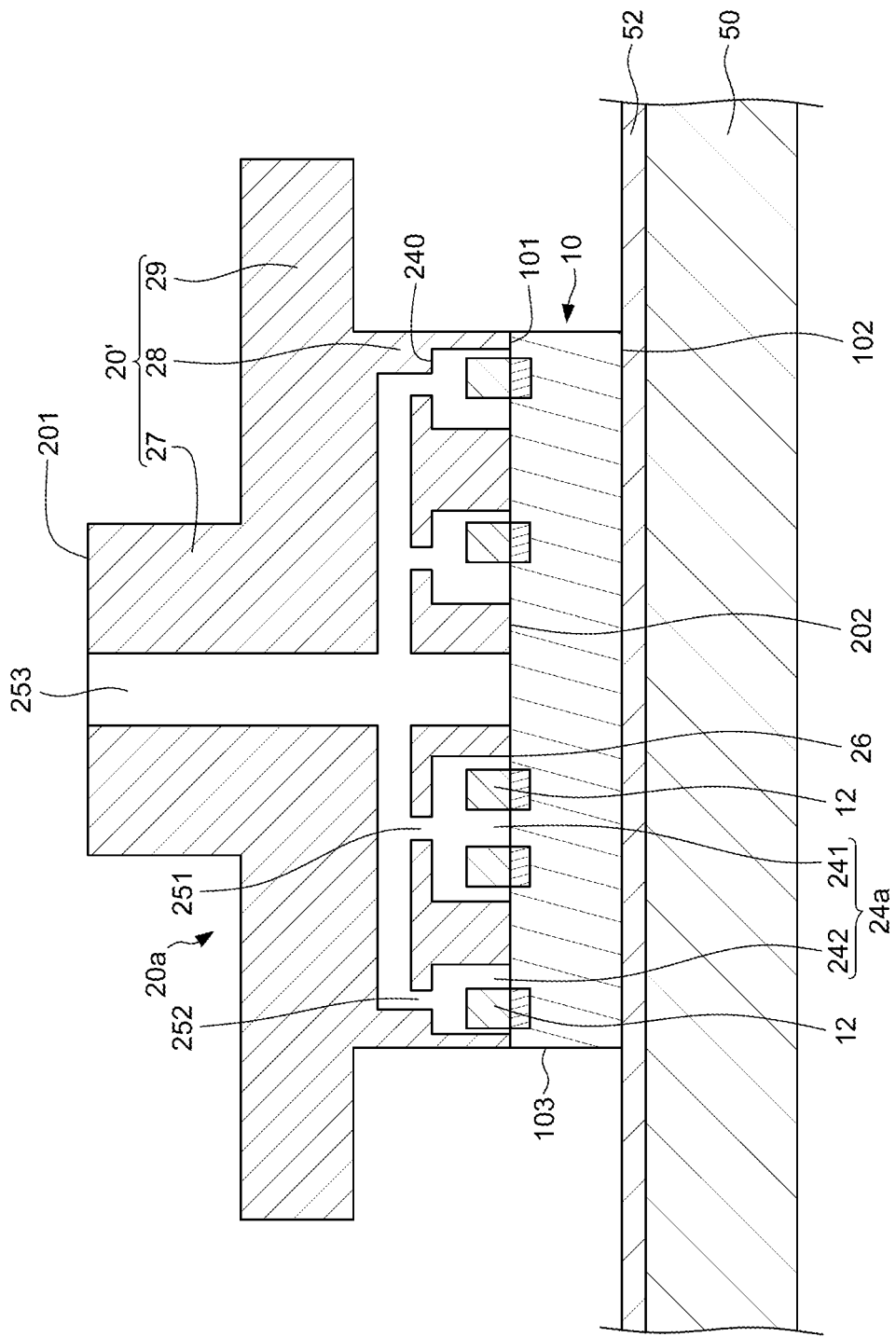
FIG. 9 illustrates a cross-sectional view of one or more stages of an example of a method for manufacturing an electronic package according to some arrangements of the present disclosure.

Referring to FIG. 9, in some arrangements, the upper surfaces of the conductive studs 12 may be spaced apart from the upper surface 240 (including, for example, the upper surface of the first recess 241 and the upper surface of the second recess 242) of the recess 24a during the pickup process, when the suction force is being applied and the surface 202 is in direct contact with the surface 101, due to the extended lateral wall of the portion 28.

Referring to FIG. 8 again, the electronic component 10 is adhered to the suction device 20a via the suction force applied through the second recess 242 and the second vacuum passage 252 to provide a second negative pressure in the second recess 242. Then, the electronic component 10 is adhered to the suction device 20a via the suction force applied through the first recess 241 and the first vacuum passage 251 to provide a first negative pressure in the first recess 241. Finally, the electronic component 10 is adhered to the suction device 20a via the suction force applied through the third vacuum passage 253 to provide a third negative pressure on the first surface 101. That is, the second negative pressure, the first negative pressure, and the third negative pressure are provided in sequence. In some arrangements, the second negative pressure may be less than the first negative pressure.

Figure 10:
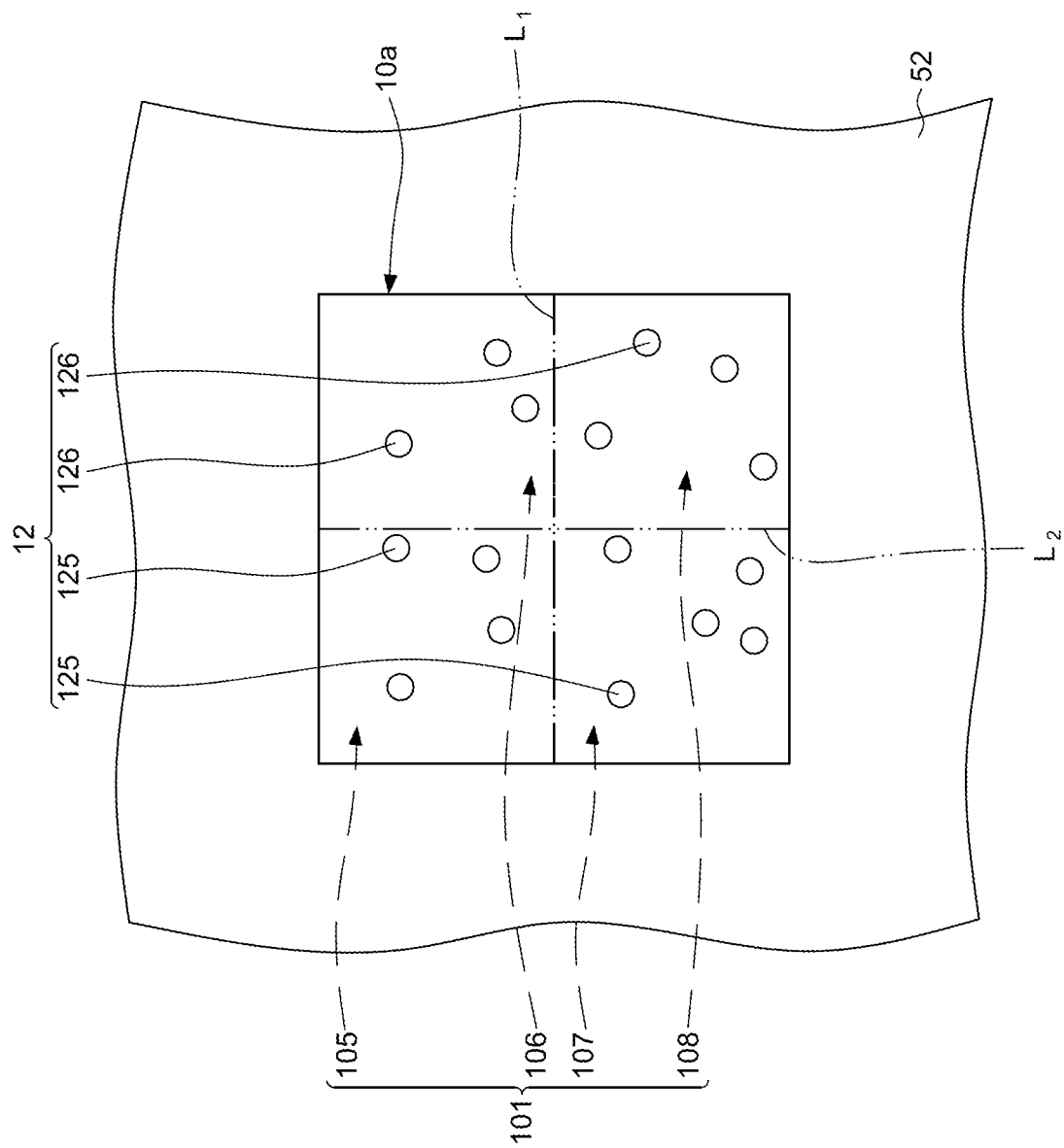
FIG. 10 illustrates a top view of one or more stages of an example of a method for manufacturing an electronic package according to some arrangements of the present disclosure.
Figure 11:
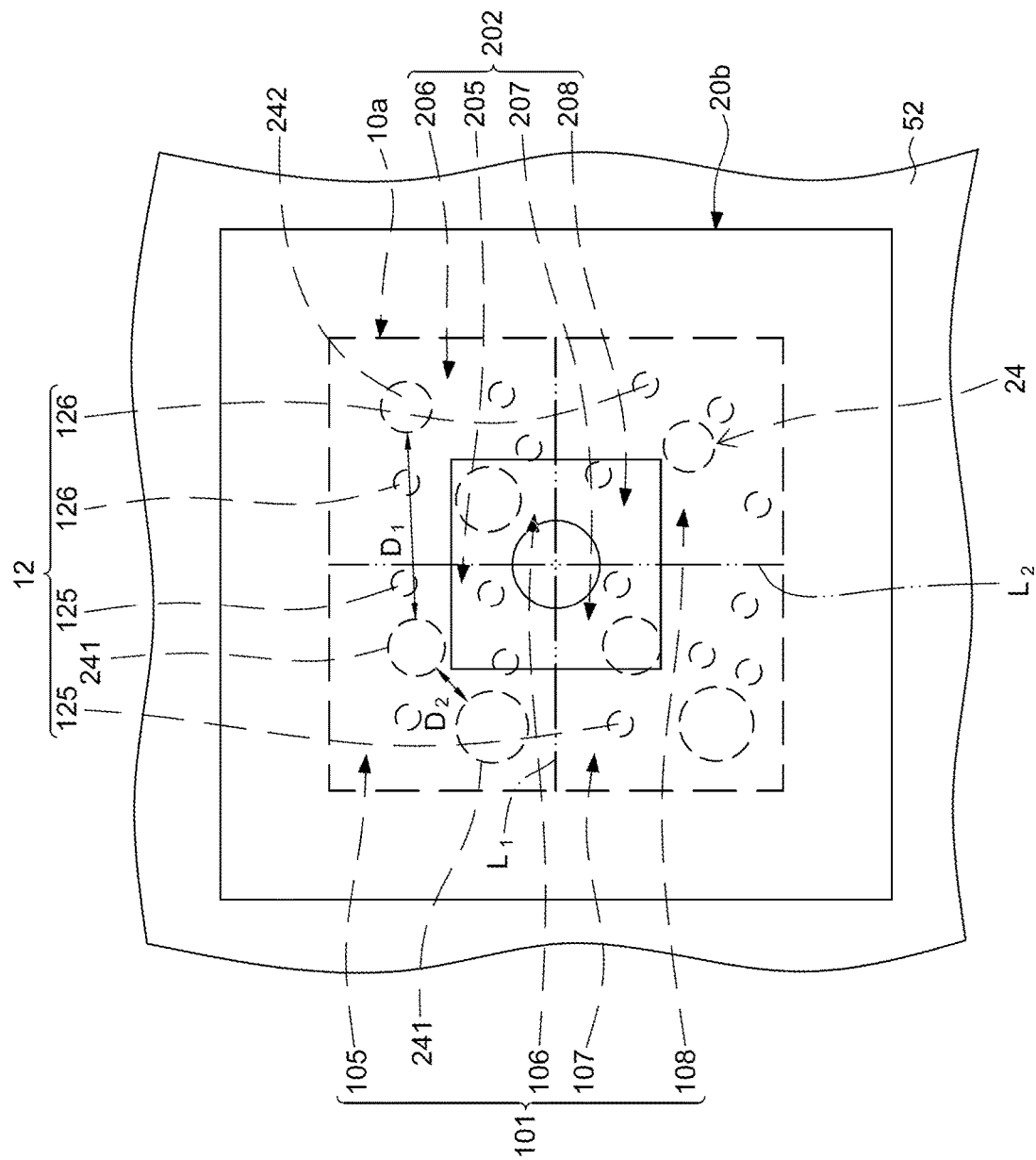
FIG. 11 illustrates a top view of one or more stages of an example of a method for manufacturing an electronic package according to some arrangements of the present disclosure.

FIGS. 10 and 11 illustrate manufacturing an electronic package according to some arrangements of the present disclosure. The stage illustrated in FIG. 10 is the same as, or similar to, the stage illustrated in FIG. 1, except that a structure of the electronic component 10a is different from the structure of the electronic component 10. The stage illustrated in FIG. 11 is the same as, or similar to, the stage illustrated in FIG. 3, except that a structure of the suction device 20b is different from the structure of the suction device 20.

Referring to FIG. 10, the first surface 101 of the electronic component 10a may be divided into a plurality of regions distinct from each other (including, for example, a first region 105, a second region 106, a third region 107 and a fourth region 108) by imaginary lines (including, for example, imaginary lines L$_1$ and L$_2$) extending from a center of the first surface 101 to an edge of the first surface 101 in a top view. In addition, the plurality of conductive studs 12 may include at least one first conductive stud 125 and at least one second conductive stud 126. The at least one first conductive stud 125 may be located or positioned in or over the first region 105 and the third region 107. The at least one second conductive stud 126 may be located or positioned in or over the second region 106 and the fourth region 108. In that regard, as shown in FIG. 10, the at least one first conductive stud 125 are located or positioned on one (left) side of the imaginary line L$_1$, and the at least one second conductive stud 126 are located or positioned on one (right) side of the imaginary line L$_1$.

Referring to FIG. 11, the bottom surface 202 of the suction device 20b may be divided into a plurality of regions (including, for example, regions 205, 206, 207 and 208) by the imaginary lines (e.g., the imaginary lines L$_1$ and L$_2$). That is, the bottom surface 202 of the suction device 20b may have the plurality of regions (e.g., the regions 205, 206, 207 and 208). In addition, the at least one recess 24 may include a plurality of recesses (including, for example, at least one first recess 241 and at least one second recess 242). The recesses (e.g., the at least one first recess 241 and the at least one second recess 242) may be located or positioned in the regions (e.g., the regions 205, 206, 207 and 208), respectively. In some arrangements, as shown in FIG. 11, the recesses (e.g., the at least one first recess 241 and the at least one second recess 242) may have different widths or diameters from the top view. Further, a distance D$_1$ between any two most adjacent recesses (e.g., between the first recess 241 and the second recess 242) may be different from a distance D$_2$ between the other two most adjacent recesses (e.g., between two first recesses 241).

When the suction device 20b is positioned to be above the first surface 101 of the electronic component 10a, the recess (e.g., the second recess 242) may be located or positioned closer to the second region 106 than to the first region 105. In addition, the second conductive stud 126 may be the conductive stud that is most adjacent to the second recess 242.

Then, the at least one first conductive stud 125 and the at least one second conductive stud 126 may be compressed simultaneously by the bottom surface 202 of the suction device 20b to level the upper surfaces of the at least one first conductive stud 125 and the at least one second conductive stud 126, so that the at least one first conductive stud 125 and the at least one second conductive stud 126 may have a substantially equal height relative to the surface 101 along or parallel to the vertical direction.

Figure 12:
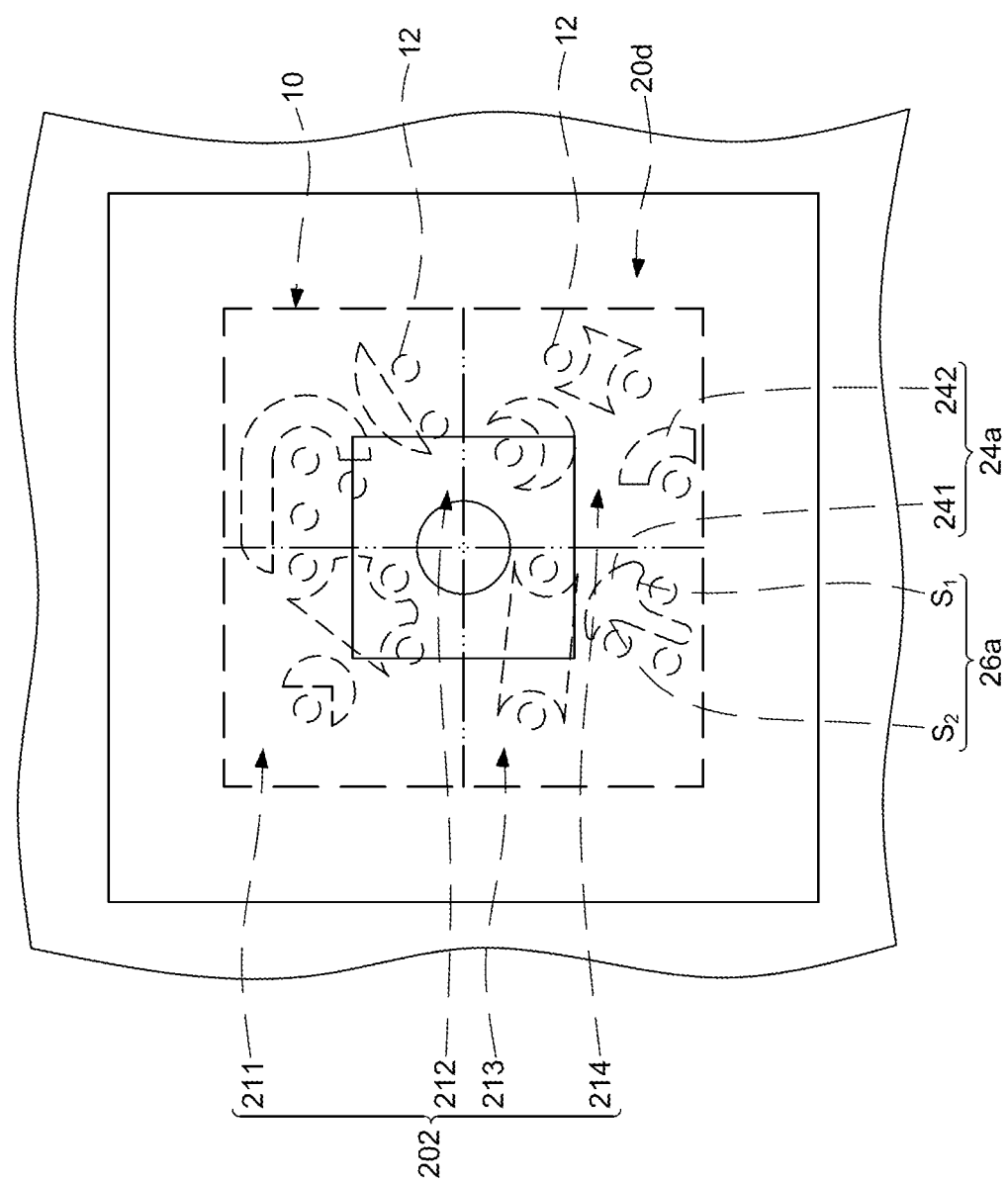
FIG. 12 illustrates a top view of one or more stages of an example of a method for manufacturing an electronic package according to some arrangements of the present disclosure.

FIG. 12 illustrates a top view of one or more stages of manufacturing an electronic package according to some arrangements of the present disclosure. The stage illustrated in FIG. 12 is the same as, or similar to, the stage illustrated in FIG. 11, except that the shapes of the recesses 24a (including, for example, the at least one first recess 241 and the at least one second recess 242). In some arrangements, as shown in FIG. 12, the recesses (e.g., the at least one first recess 241 and the at least one second recess 242) may be irregularly shaped. Some of the recesses may be geometrically distinct from at least another recess. That is, the edges 26a of the recesses (e.g., the at least one first recess 241 and the at least one second recess 242) may be irregularly shaped. In some arrangements, the outer edge 26a of the recess (e.g., the first recess 241) may include at least two curved surfaces (including, for example, curved surfaces $S_1$ and $S_2$) with different curvatures to adapt to a position, size, and/or a shape of at least one conductive stud 12. That is, a position, size, and/or a shape of the recess (e.g., the first recess 241) may be determined by the position and/or the shape of the conductive stud 12, in order to entirely enclose some conductive studs while avoiding other conductive studs as disclosed herein.

Figure 13:
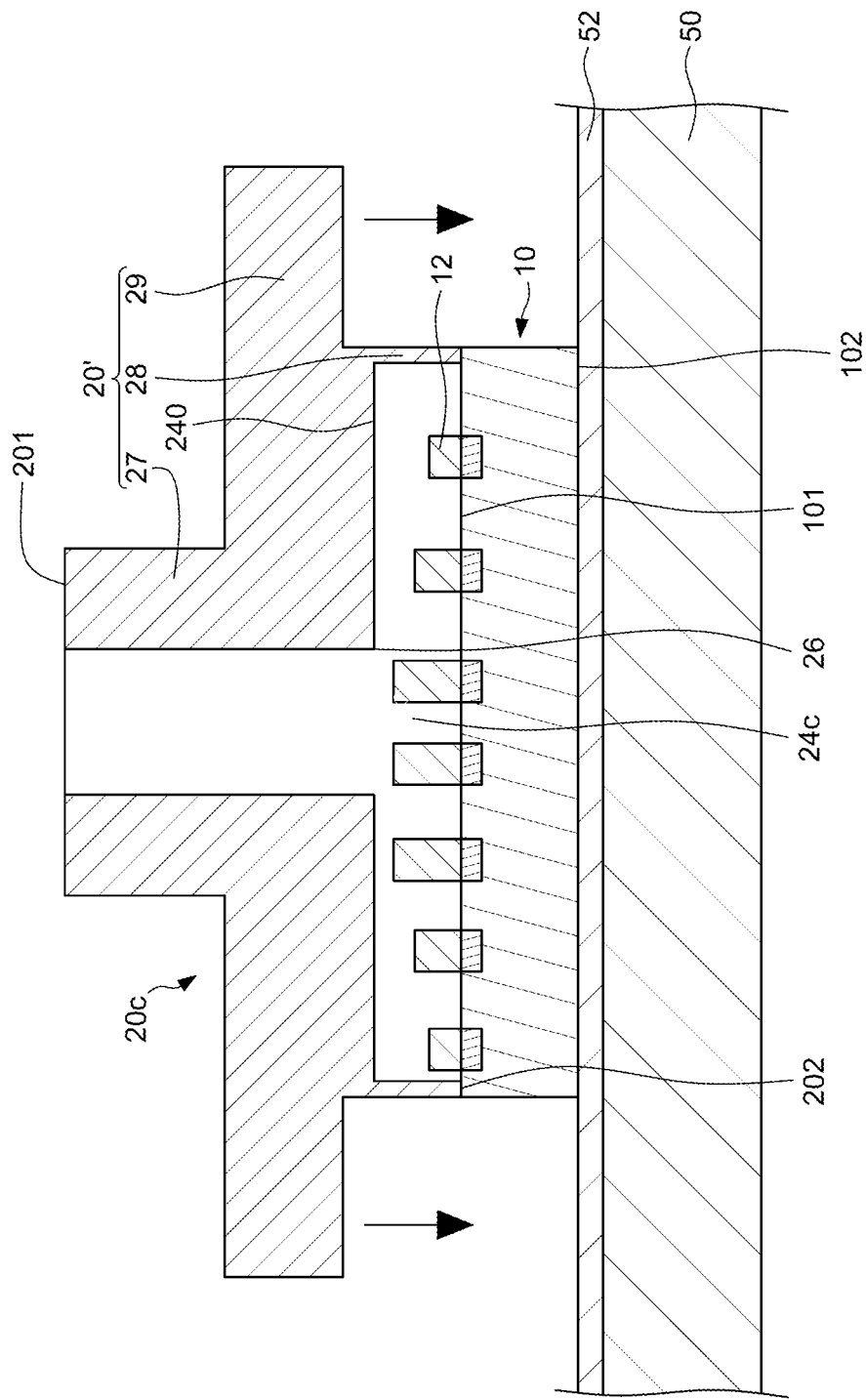
FIG. 13 illustrates a cross-sectional of one or more stages of an example of a method for manufacturing an electronic package according to some arrangements of the present disclosure.

FIG. 13 illustrates a cross-sectional view of one or more stages of manufacturing an electronic package according to some arrangements of the present disclosure. The stage illustrated in FIG. 13 is the same as, or similar to, the stage illustrated in FIG. 8, except that a structure of the suction device 20c is different from the structure of the suction device 20a. In some arrangements, as shown in FIG. 13, the suction device 20c may include only single recess 24c to accommodate the multiple conductive studs 12. That is, all of the conductive studs 12 may be inserted into, drawn into, or enclosed by the single recess 24c.

Figure 14:
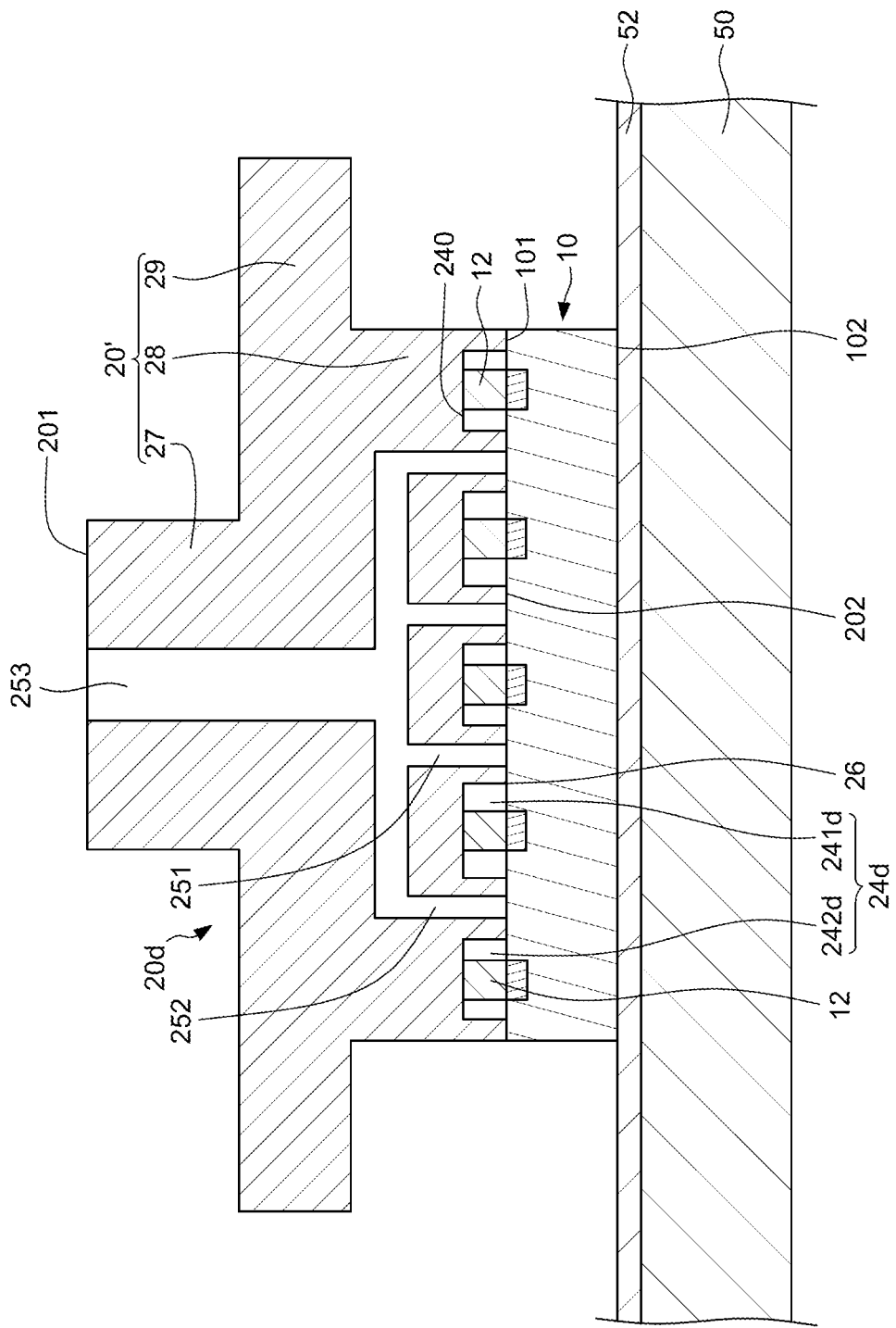
FIG. 14 illustrates a cross-sectional view of one or more stages of an example of a method for manufacturing an electronic package according to some arrangements of the present disclosure.

FIG. 14 illustrates a cross-sectional view of one or more stages of manufacturing an electronic package according to some arrangements of the present disclosure. The stage illustrated in FIG. 14 is the same as, or similar to, the stage illustrated in FIG. 8, except that a structure of the suction device 20d is different from the structure of the suction device 20a. In some arrangements, as shown in FIG. 14, the recesses 24d (including, for example, the at least one first recess 241d and the at least one second recess 242d) may not link to or is not in fluid communication with the vacuum passages (including, for example, the at least one first vacuum passage 251, the at least one second vacuum passage 252, and the third vacuum passage 253) while the suction force is being applied during the pickup process. As shown, while the suction force is being applied during the pickup process and when the surface 202 is in direct contact with the surface 101, the at least one first recess 241d and the at least one second recess 242d is physically isolated from the vacuum passages and enclose respective conductive studs 12 entirely. In addition, a number of the conductive studs 12 in each of the different recesses (e.g., the at least one first recess 241d and the at least one second recess 242d) may be the same.

Figure 15:
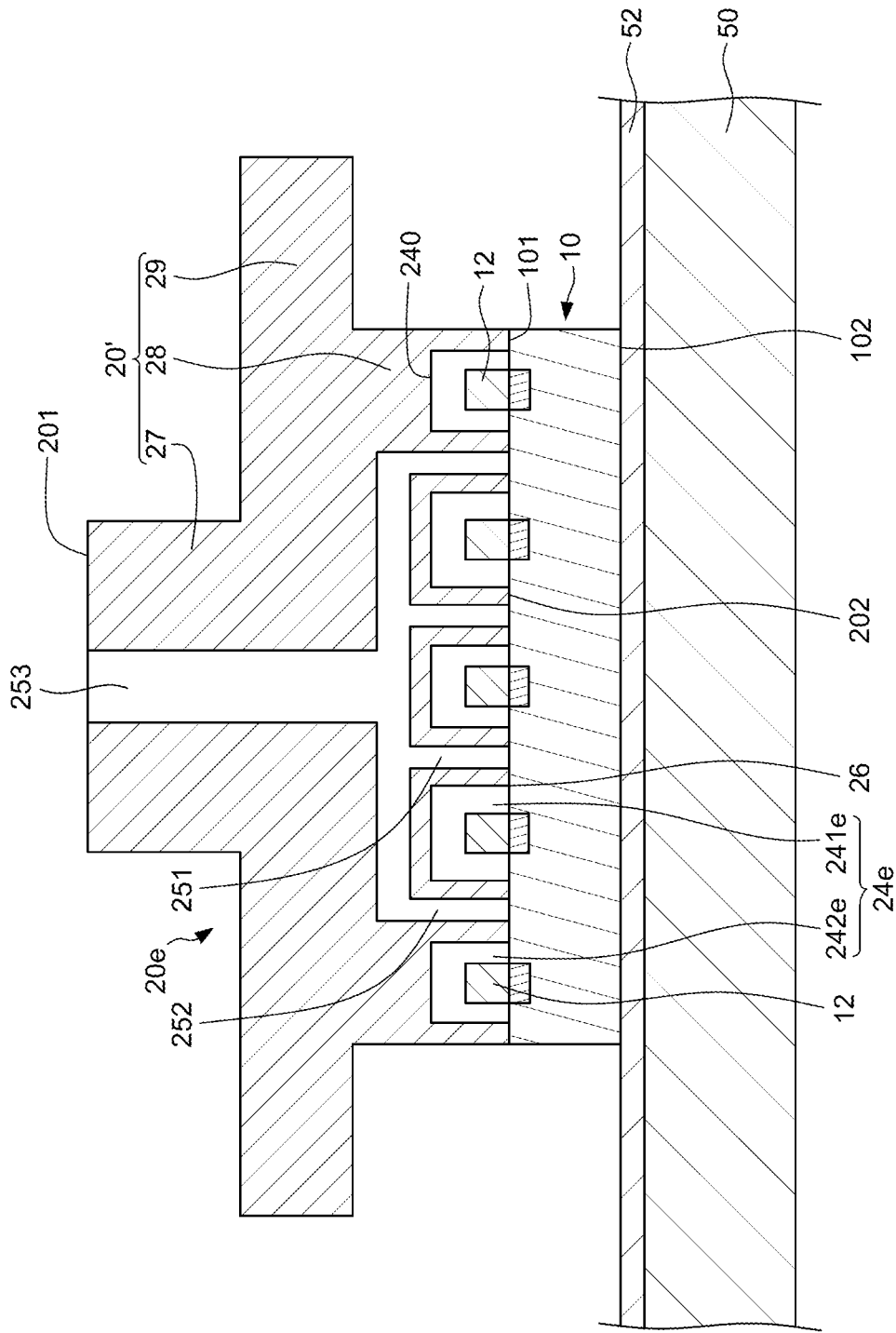
FIG. 15 illustrates a cross-sectional view of one or more stages of an example of a method for manufacturing an electronic package according to some arrangements of the present disclosure.

FIG. 15 illustrates a cross-sectional view of one or more stages of manufacturing an electronic package according to some arrangements of the present disclosure. The stage illustrated in FIG. 15 is the same as, or similar to, the stage illustrated in FIG. 14, except that configurations of the conductive studs 12 and the recesses 24e (including, for example, the at least one first recess 241e and the at least one second recess 242e) are different from the configurations of the conductive studs 12 shown in FIG. 14. In some arrangements, as shown in FIG. 15, the conductive studs 12 may be arranged in the recesses (e.g., the at least one first recess 241e and the at least one second recess 242e) of suction device 20e and spaced apart from the upper surface 240 (including, for example, the upper surface of the first recess 241e and the upper surface of the second recess 242e) of the recess 24a while the suction force is being applied during the pickup process and when the surface 202 is in direct contact with the surface 101. That is, depths of the recesses (e.g., the at least one first recess 241e and the at least one second recess 242e) or the height of the recesses relative to the surface 101 or 202 may be greater than heights of the conductive studs 12 relative to the surface 101.

Figure 16:
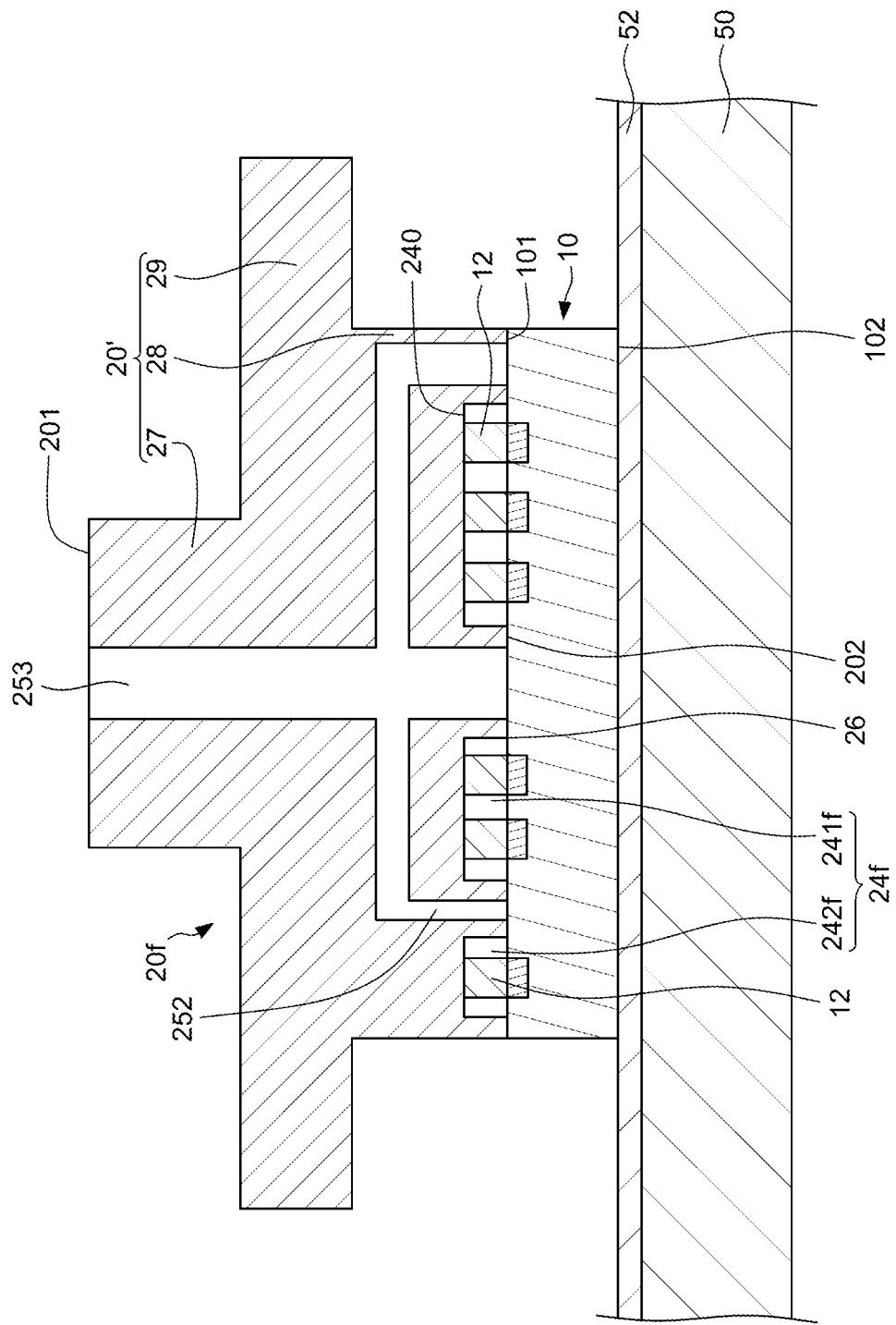
FIG. 16 illustrates a cross-sectional view of one or more stages of an example of a method for manufacturing an electronic package according to some arrangements of the present disclosure.

FIG. 16 illustrates a cross-sectional view of one or more stages of manufacturing an electronic package according to some arrangements of the present disclosure. The stage illustrated in FIG. 16 is the same as, or similar to, the stage illustrated in FIG. 14, except for a number of the conductive studs 12 in the recesses 24f (including, for example, the at least one first recess 241f and the at least one second recess 242f) of suction device 20f is different from the number of conductive studs 12 in the recesses 24f shown in FIG. 14. In some arrangements, as shown in FIG. 16, the number of the conductive studs 12 in different recesses 24f (e.g., the at least one first recess 241f and the at least one second recess 242f) may be different. In addition, the at least one first vacuum passage 251 of FIG. 14 may be omitted.

Figure 17:
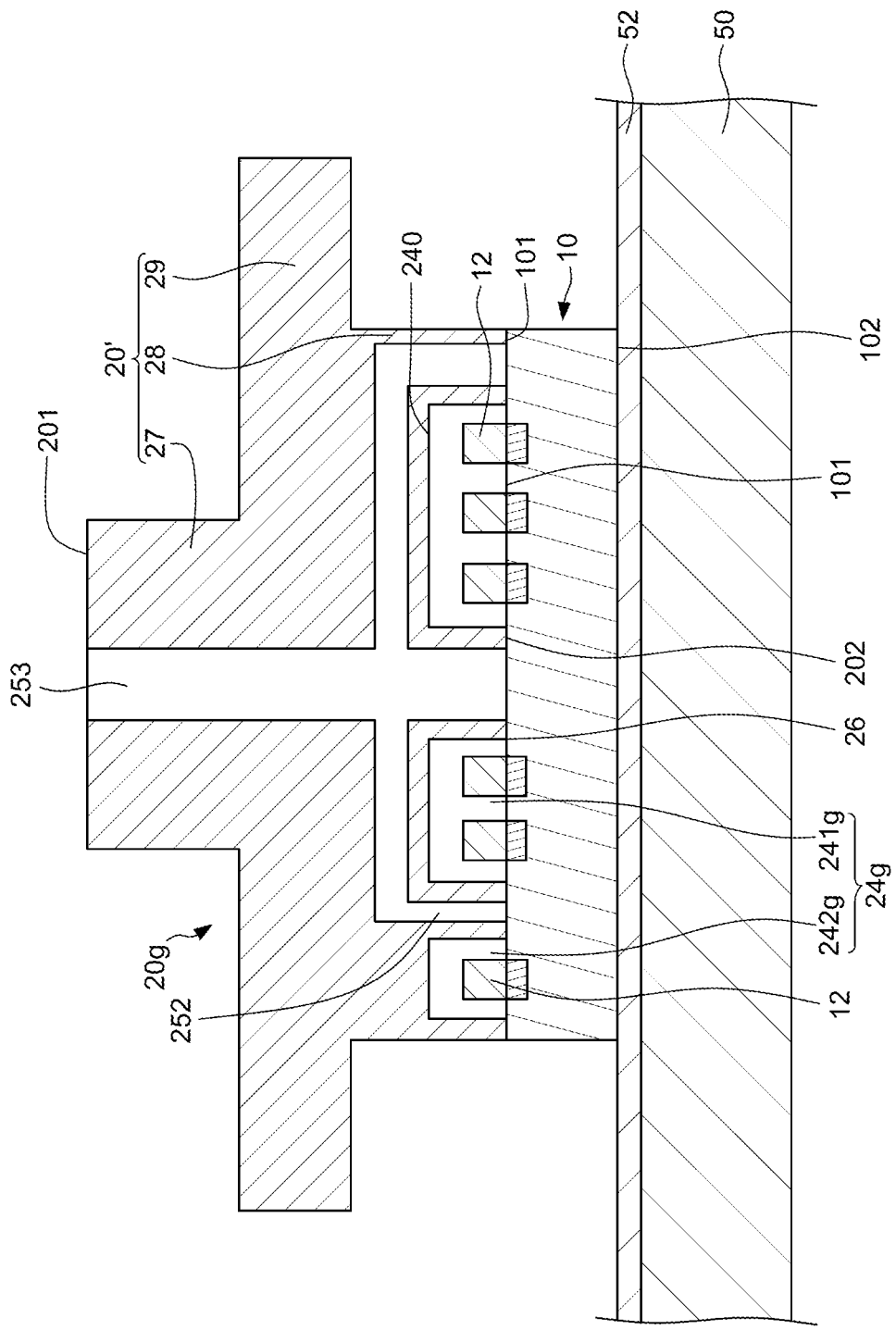
FIG. 17 illustrates a cross-sectional view of one or more stages of an example of a method for manufacturing an electronic package according to some arrangements of the present disclosure.

FIG. 17 illustrates a cross-sectional view of one or more stages of manufacturing an electronic package according to some arrangements of the present disclosure. The stage illustrated in FIG. 17 is the same as, or similar to, the stage illustrated in FIG. 16, except that configurations of the conductive studs 12 and the recesses 24g (including, for example, the at least one first recess 241g and the at least one second recess 242g) of suction device 20g are different from the configurations of the conductive studs 12 and the recesses 24f In some arrangements, as shown in FIG. 17, the conductive studs 12 may be arranged in the recesses 24g (e.g., the at least one first recess 241g and the at least one second recess 242g) and spaced apart from the upper surface 240 (including, for example, the upper surface of the first recess 241g and the upper surface of the second recess 242g) of the recess 24a while the suction force is being applied during the pickup process and when the surface 202 is in direct contact with the surface 101. That is, depths of the recesses (e.g., the at least one first recess 241g and the at least one second recess 242g) or the height of the recesses 24g relative to the surface 101 or 202 may be greater than heights of the conductive studs 12 relative to the surface 101.

Figure 18:
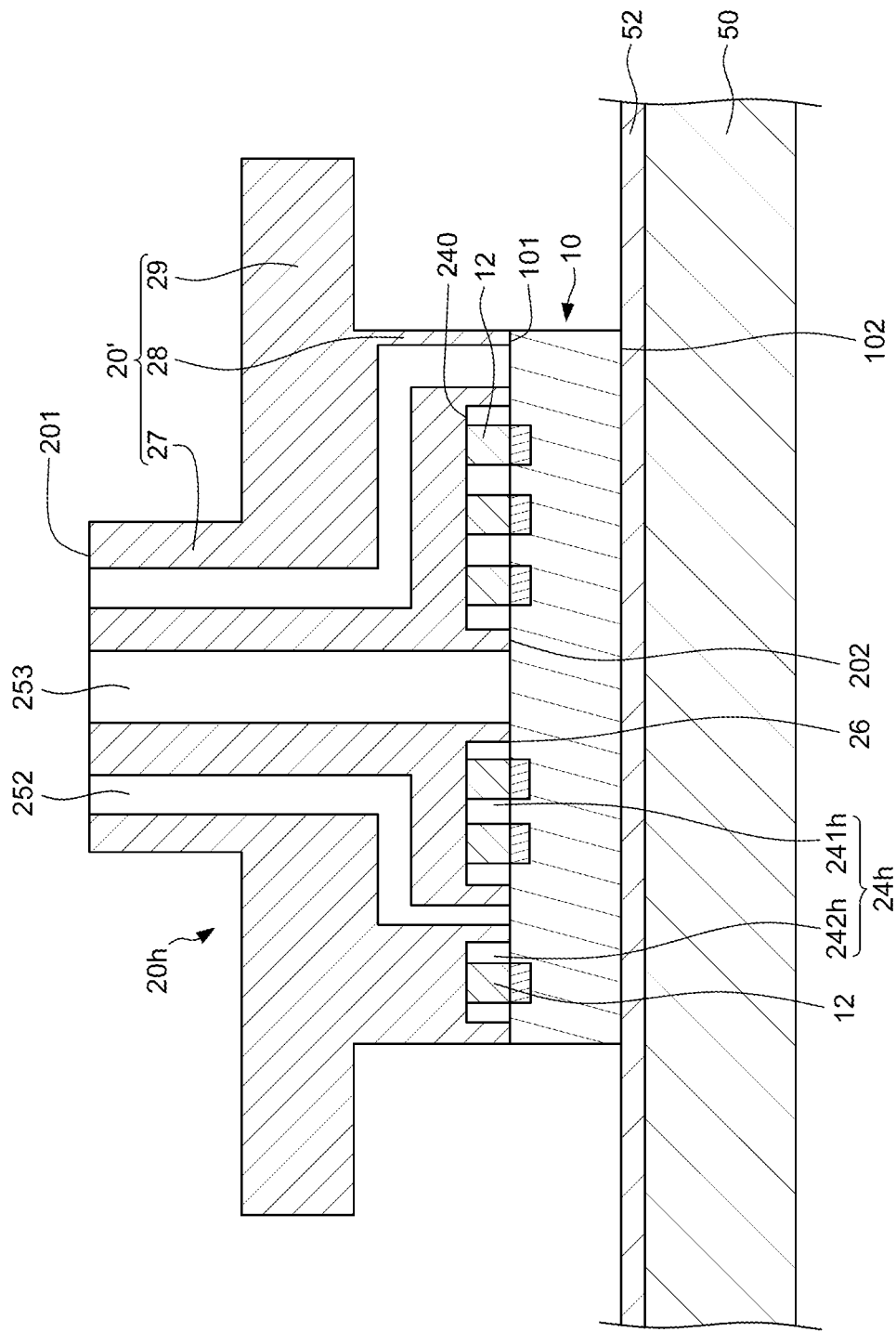
FIG. 18 illustrates a cross-sectional view of one or more stages of an example of a method for manufacturing an electronic package according to some arrangements of the present disclosure.

FIG. 18 illustrates a cross-sectional view of one or more stages of manufacturing an electronic package according to some arrangements of the present disclosure. The stage illustrated in FIG. 18 is the same as, or similar to, the stage illustrated in FIG. 16, except for a structure of the suction device 20h with recesses 24h is different from the structure of the suction device 20f. In some arrangements, as shown in FIG. 18, the at least one second vacuum passage 252 may extend through the main body 20' (including, for example, the first portion 27, the intermediate portion 29 and the second portion 28). Thus, the at least one second vacuum passage 252 may not link to or may not be in fluid communication with the third vacuum passage 253.

Figure 19:
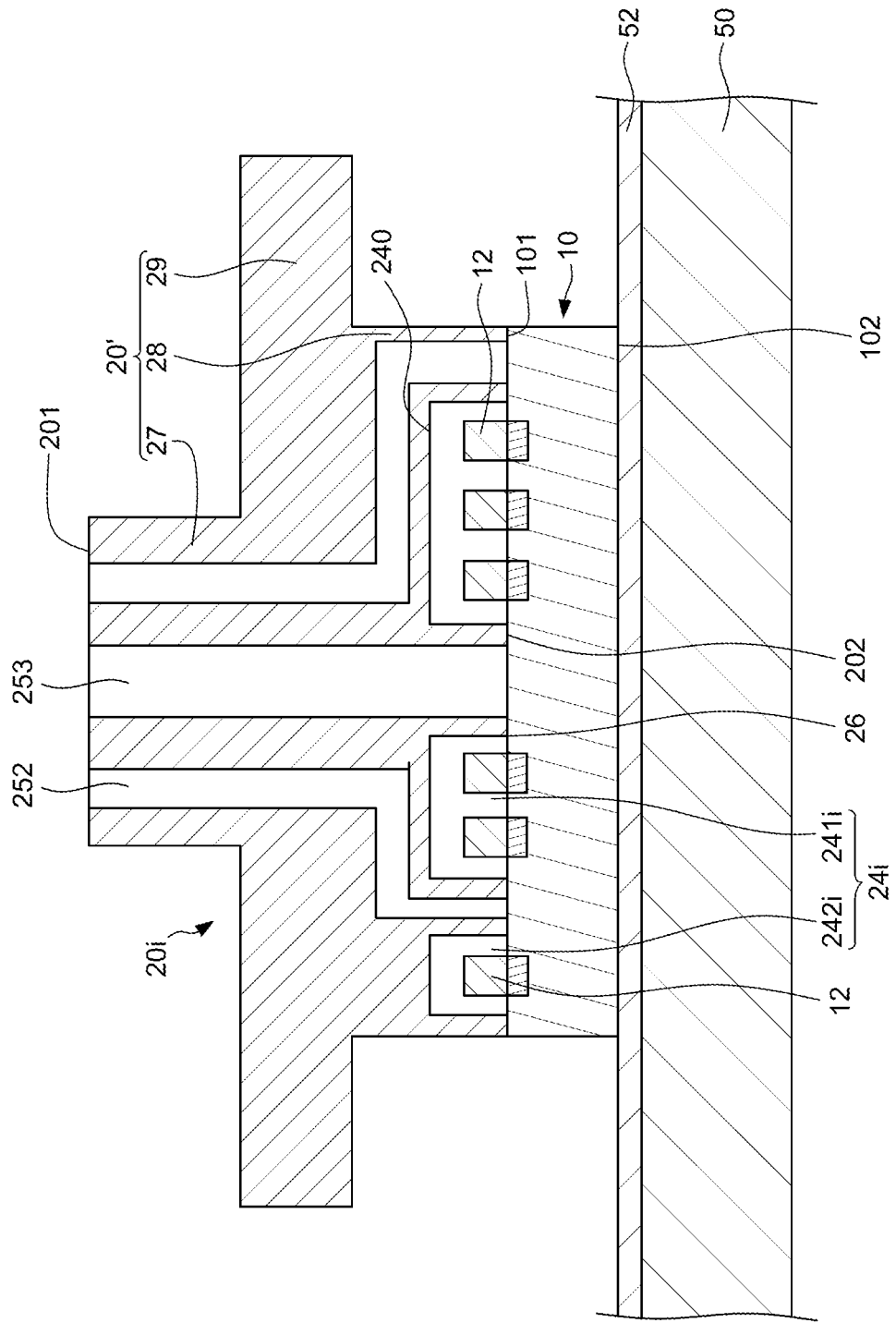
FIG. 19 illustrates a cross-sectional view of one or more stages of an example of a method for manufacturing an electronic package according to some arrangements of the present disclosure.

FIG. 19 illustrates a cross-sectional view of one or more stages of manufacturing an electronic package according to some arrangements of the present disclosure. The stage illustrated in FIG. 19 is the same as, or similar to, the stage illustrated in FIG. 18, except for configurations of the conductive studs 12 and the recesses 24i (including, for example, the at least one first recess 241i and the at least one second recess 242i) of suction device 20i. In some arrangements, as shown in FIG. 19, the conductive studs 12 may be arranged in the recesses (e.g., the at least one first recess 241*i* and the at least one second recess 242*i*) and spaced apart from the upper surface 240 (including, for example, the upper surface of the first recess 241*i* and the upper surface of the second recess 242*i*) of the recess 24*i* while the suction force is being applied during the pickup process and when the surface 202 is in direct contact with the surface 101. That is, depths of the recesses (e.g., the at least one first recess 241*i* and the at least one second recess 242*i*) or the height of the recesses 24*i* relative to the surface 101 or 202 may be greater than heights of the conductive studs 12 relative to the surface 101.

Figure 20:
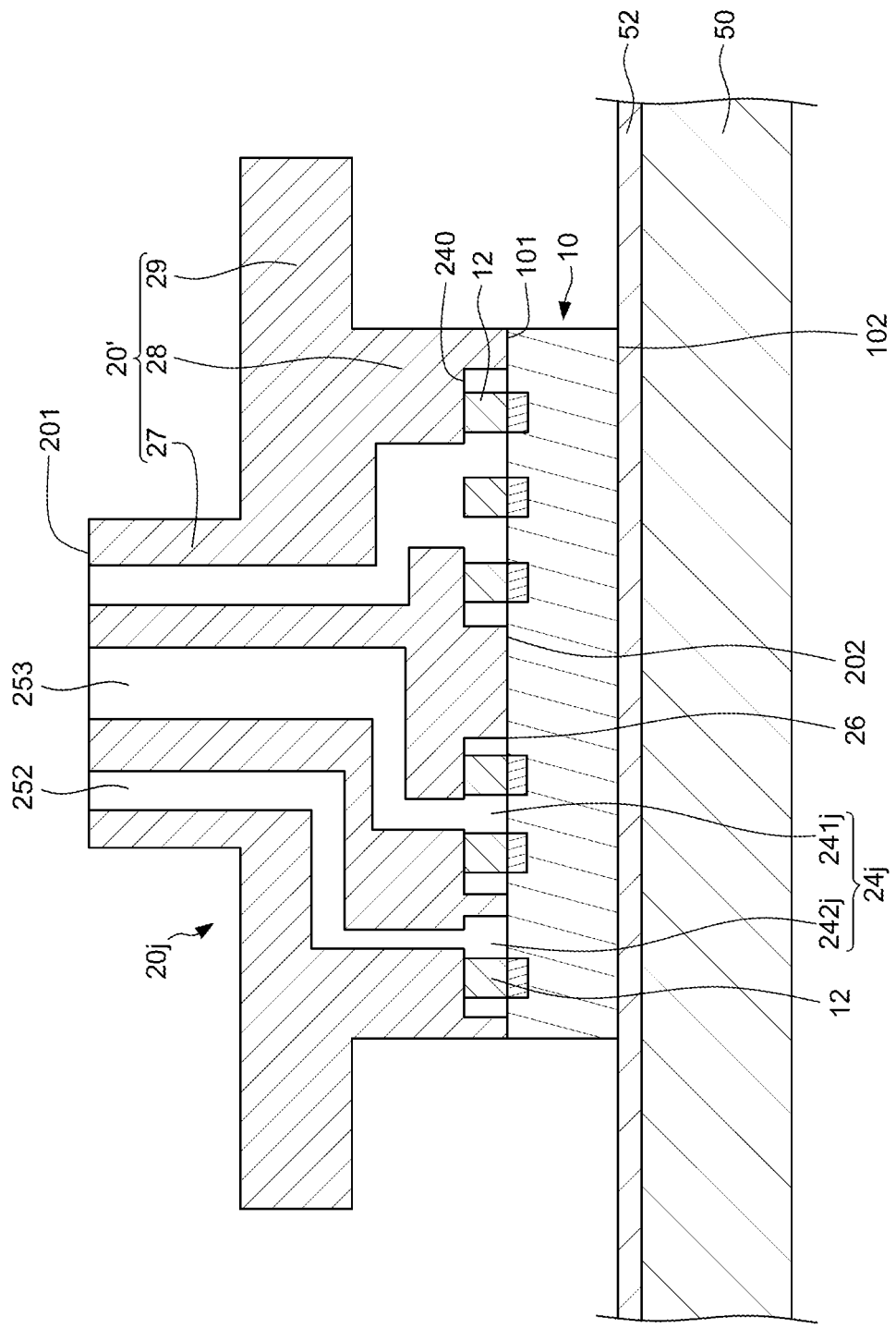
FIG. 20 illustrates a cross-sectional view of one or more stages of an example of a method for manufacturing an electronic package according to some arrangements of the present disclosure.

FIG. 20 illustrates a cross-sectional view of one or more stages of manufacturing an electronic package according to some arrangements of the present disclosure. The stage illustrated in FIG. 20 is the same as, or similar to, the stage illustrated in FIG. 18, except for a structure of the suction device 20*j* is different from the structure of the suction device 20*h*. In some arrangements, as shown in FIG. 20, the first recess 241*j* may be linked to the third vacuum passage 253, and the second recess 242*j* may be linked to the second vacuum passage 252. As shown, both the second vacuum passage 252 and the third vacuum passage 253 may extend entirely through the main body 20' (including, for example, the first portion 27, the intermediate portion 29 and the second portion 28), from the surface 201 to the surface 202. The suction device 20*j* may have recesses 24*j* (including, for example, the at least one first recess 241*j* and the at least one second recess 242*j*) as shown.

Figure 21:
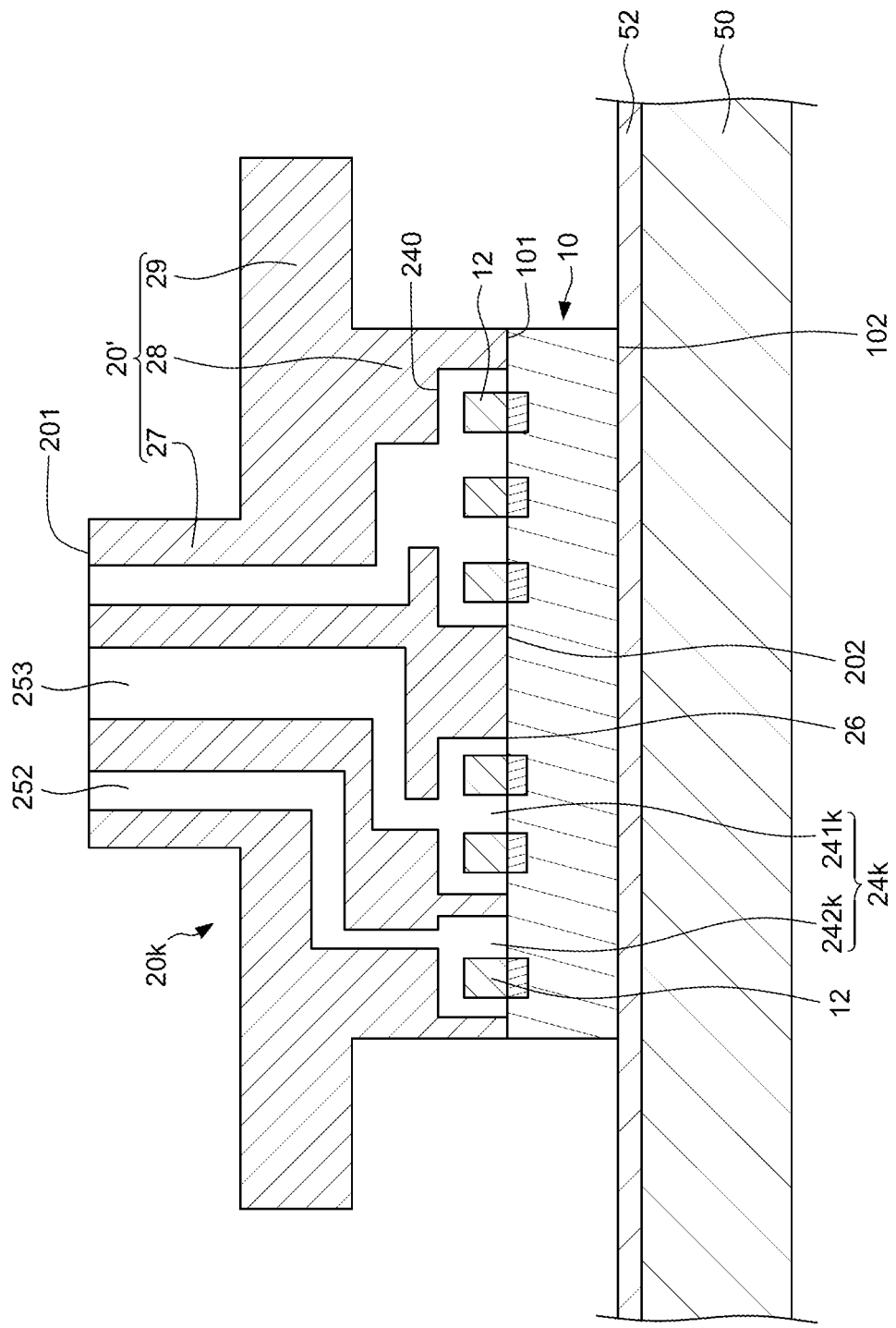
FIG. 21 illustrates a cross-sectional view of one or more stages of an example of a method for manufacturing an electronic package according to some arrangements of the present disclosure.

FIG. 21 illustrates a cross-sectional view of one or more stages of manufacturing an electronic package according to some arrangements of the present disclosure. The stage illustrated in FIG. 21 is the same as, or similar to, the stage illustrated in FIG. 20, except that configurations of the conductive studs 12 and the recesses 24*k* of suction device 20*k* (including, for example, the at least one first recess 241*k* and the at least one second recess 242*k*) are different from the configurations of the conductive studs 12 and the recesses 24*j*. In some arrangements, as shown in FIG. 21, the conductive studs 12 may be arranged in the recesses (e.g., the at least one first recess 241*k* and the at least one second recess 242*k*) and spaced apart from the upper surface 240 (including, for example, the upper surface of the first recess 241*k* and the upper surface of the second recess 242*k*) of the recess 24*a*. That is, depths of the recesses (e.g., the at least one first recess 241*k* and the at least one second recess 242*k*) or the height of the recesses 24*k* relative to the surface 101 or 202 may be greater than heights of the conductive studs 12 relative to the surface 101.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing an electronic package, comprising:
    providing an electronic component having a first surface and including a plurality of conductive studs on the first surface;
    providing a suction device having at least one recess;
    aligning an edge of the at least one recess to a space between two adjacent conductive studs of the plurality of conductive studs;
    moving the electronic component with the suction device;
    positioning one of the plurality of conductive studs inside a vertical projection area of one of the at least one recess and positioning the other one of the plurality of conductive studs outside the vertical projection area before the electronic component is moved by the suction device; and
    enclosing the one of the plurality of conductive studs partially into the one of the at least one recess, wherein the one of the plurality of conductive studs includes a first portion horizontally overlapping the edge of the at least one recess and a second portion free from horizontally overlapping the edge of the at least one recess.

2. The method of claim 1, wherein in the step of moving the electronic component with the suction device, the edge of the at least one recess is located between two adjacent conductive studs of the plurality of conductive studs.

3. The method of claim 2, wherein in the step of moving the electronic component with the suction device, the two adjacent conductive studs includes a first conductive stud and a second conductive stud, and a first distance between the first conductive stud and the edge is different from a second distance between the second conductive stud and the edge.

4. The method of claim 3, wherein the second distance is greater than the first distance.

5. The method of claim 3, further comprising:
    contacting the second conductive stud by the suction device.

6. The method of claim 1, wherein a height of the first portion is less than a height of the second portion.

* * * * *